US012648339B2

(12) United States Patent
Okabe et al.

(10) Patent No.: US 12,648,339 B2
(45) Date of Patent: Jun. 2, 2026

(54) DISPLAY DEVICE

(71) Applicant: Sharp Display Technology Corporation, Kameyama City (JP)

(72) Inventors: Tohru Okabe, Kameyama City (JP); Shoji Okazaki, Kameyama City (JP); Shinsuke Saida, Kameyama City (JP); Shinji Ichikawa, Kameyama City (JP); Hiroki Taniyama, Kameyama City (JP); Eiji Fujimoto, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 437 days.

(21) Appl. No.: 18/286,193

(22) PCT Filed: May 19, 2021

(86) PCT No.: PCT/JP2021/019053
§ 371 (c)(1),
(2) Date: Oct. 9, 2023

(87) PCT Pub. No.: WO2022/244160
PCT Pub. Date: Nov. 24, 2022

(65) Prior Publication Data
US 2024/0381743 A1 Nov. 14, 2024

(51) Int. Cl.
*H10K 59/80* (2023.01)
*H10K 50/00* (2023.01)
(Continued)

(52) U.S. Cl.
CPC ......... *H10K 59/8731* (2023.02); *H10K 50/00* (2023.02); *H10K 59/00* (2023.02);
(Continued)

(58) Field of Classification Search
CPC .... H10K 59/8731; H10K 50/00; H10K 59/00; H10K 59/131; H10K 59/40;
(Continued)

(56) References Cited

U.S. PATENT DOCUMENTS 10,347,866 B1* 7/2019 Kim ....................... H10K 59/88
2003/0164674 A1* 9/2003 Imamura .............. H10K 59/122
313/493
(Continued)

FOREIGN PATENT DOCUMENTS

JP 2012-253036 A 12/2012

*Primary Examiner* — S M Sohel Imtiaz
(74) *Attorney, Agent, or Firm* — ScienBiziP, P.C.

(57) ABSTRACT

An organic EL display device has a picture-frame region provided with: dam walls extending along an outer periphery of a display region to block an organic sealing layer; and a second lead wire running from toward the display region, crossing the dam walls, and extending out of the picture-frame region. The picture-frame region includes a spacer wall extending along the dam wall and provided to an outer periphery of a portion, of the dam wall, intersecting at least with the second lead wire. The spacer wall has an upper portion provided with a plurality of protruding portions at intervals along the spacer wall. The second lead wire extends to cross a portion of, the spacer wall, away from the protruding portions.

9 Claims, 27 Drawing Sheets

(51) Int. Cl.
  *H10K 59/00* (2023.01)
  *H10K 59/131* (2023.01)
  *H10K 59/40* (2023.01)

(52) U.S. Cl.
  CPC ........... *H10K 59/131* (2023.02); *H10K 59/40* (2023.02); *H10K 59/8722* (2023.02); *H10K 59/8723* (2023.02); *H10K 59/873* (2023.02)

(58) Field of Classification Search
  CPC ........... H10K 59/8722; H10K 59/8723; H10K 59/873; H10K 59/122; H05B 33/04
  See application file for complete search history.

(56)      References Cited

U.S. PATENT DOCUMENTS

| | | | |
|---|---|---|---|
| 2006/0192487 A1* | 8/2006 | Choi | H10K 59/8792 |
| | | | 445/25 |
| 2006/0270305 A1 | 11/2006 | Imamura | |
| 2009/0179566 A1 | 7/2009 | Imamura | |
| 2010/0078627 A1* | 4/2010 | Yoshinaga | H10K 59/122 |
| | | | 257/40 |
| 2010/0244057 A1* | 9/2010 | Ryu | H10K 59/8722 |
| | | | 257/40 |
| 2017/0110686 A1* | 4/2017 | Kamiya | H10K 59/38 |
| 2018/0097198 A1* | 4/2018 | Chou | H10K 59/873 |
| 2018/0323403 A1* | 11/2018 | Nozawa | H10K 59/876 |
| 2019/0172893 A1* | 6/2019 | Lee | H10K 59/1275 |
| 2019/0214587 A1* | 7/2019 | Kim | G09F 9/301 |
| 2020/0067016 A1* | 2/2020 | Park | H10K 59/131 |
| 2020/0150847 A1* | 5/2020 | Jang | G06F 3/0443 |
| 2021/0104708 A1* | 4/2021 | Fukuoka | H10K 50/865 |
| 2021/0217835 A1* | 7/2021 | Park | H10K 50/844 |

* cited by examiner

ELVDD

PI

55

28gl

50A

50B

50C

70

ELVSS

LINE XXVIIB–XXVIIB CROSS-SECTION

LINE XXVIIA–XXVIIA CROSS-SECTION

DISPLAY DEVICE

TECHNICAL FIELD

The present disclosure relates to a display device.

BACKGROUND ART

In recent years, organic electroluminescence (EL) display devices using organic EL elements have been put into practical use.

In an organic EL display device, each of a plurality of organic EL elements includes: a pair of electrodes facing each other; and an organic EL layer provided between the pair of electrodes. The organic EL layer has a plurality of functional layers including a hole transport layer and a light-emitting layer made of an organic material and stacked on top of another. These functional layers and electrodes are formed by evaporation using, for example, such film forming masks referred to as a common metal mask (CMM) provided with openings that allow patterning for each display panel, and a fine metal mask (FMM) provided with openings that allow patterning for each subpixel.

Furthermore, the organic EL display device includes a sealing film to cover the organic EL elements in order to reduce deterioration of the organic EL elements because of intrusion of, for example, water and oxygen. Suitably employed as the sealing film is a multilayer film including an inorganic sealing layer and an organic sealing layer. The inorganic sealing layer is formed by, for example, plasma chemical vapor deposition (CVD). The organic sealing layer is formed by coating such as, for example, inkjet printing. In the production process, the organic EL display device is provided with a dam wall serving as a wall body to block an organic material (ink), which forms the organic sealing layer, from spreading out of the picture-frame region (see, for example, Patent Document 1).

CITATION LIST

Patent Literature

[Patent Document 1] Japanese Unexamined Patent Application Publication No. 2012-253036

SUMMARY

Technical Problems

If the organic EL display device is provided with an on-cell touch panel, the touch panel is formed on the sealing film. In this case, a wire has to be led to the picture-frame region from a detecting electrode for detecting a touch position on the touch panel. This lead wire could be broken on a top portion of the dam wall. It is because the dam wall is relatively high, and, when a resist is provided on a top portion of the dam wall so as to be used as a mask for patterning of the lead wire, the resist cannot have a sufficient thickness when formed.

Furthermore, in producing the organic EL display device, a film forming mask is used for depositing a functional layer and an electrode of the organic EL layer by evaporation. The film forming mask is in contact with the top portion of the dam wall. For this reason, the top portion of the dam wall is likely to have irregularities, and, a foreign substance is likely to be formed on the dam wall and the surroundings of the dam wall. The irregularities and the foreign substance are difficult to be ideally covered with the sealing film, and cause a coverage failure. If the coverage failure occurs in or near a region coated with an organic resin material forming the organic sealing layer 84, water might enter the display region and cause degradation of the organic EL elements.

A technique of the present disclosure is directed to a display device, and sets out to reduce the risks of a wire to be broken on a wall and water to enter the display region.

Solution to Problems

A technique of the present disclosure is directed to a display device including: a substrate layer; a light-emitting element layer supported by the substrate layer and including a plurality of light-emitting elements; and a sealing film provided above the light-emitting element layer and covering the plurality of light-emitting elements. The display device according to a technique of the present disclosure includes a display region that displays an image using light emitted from the light-emitting elements, and a picture-frame region provided outside the display region. The sealing film includes an organic sealing layer provided to the display region. The picture-frame region includes: a wall body extending along an outer periphery of the display region; and a wire running from toward the display region, crossing the wall body, and extending out of the picture-frame region. The wall body includes: a dam wall that keeps an organic material, forming the organic sealing layer, from spreading out of the picture-frame region; and a spacer wall extending in an outer periphery of the dam wall along a portion, of the dam wall, intersecting at least with the wire. The spacer wall has an upper portion provided with a plurality of protruding portions extending in a height direction of the spacer wall at intervals along the dam wall. The wire extends to cross a portion, of the spacer wall, away from the protruding portions.

Advantageous Effect of Disclosure

A technique of the present disclosure can reduce the risks of a wire to be broken on a wall and water to enter the display region.

BRIEF DESCRIPTION OF DRAWINGS

FIG. 6 is a cross-sectional view of the organic EL display device, taken along line VI-VI in FIG. 5.

FIG. 15 corresponds to FIG. 12.

FIG. 16 corresponds to FIG. 13.

FIG. 17 corresponds to FIG. 13.

FIG. 18 corresponds to FIG. 13.

FIG. 21 is a cross-sectional view of the organic EL display device in the second modification according to the first embodiment. FIG. 21 corresponds to FIG. 11.

FIG. 22 corresponds to FIG. 6.

FIG. 24 corresponds to FIG. 11.

FIG. 25 corresponds to FIG. 11.

FIG. 26 corresponds to FIG. 9.

FIG. 28 corresponds to FIG. 14.

DESCRIPTION OF EMBODIMENTS

Figure 1:
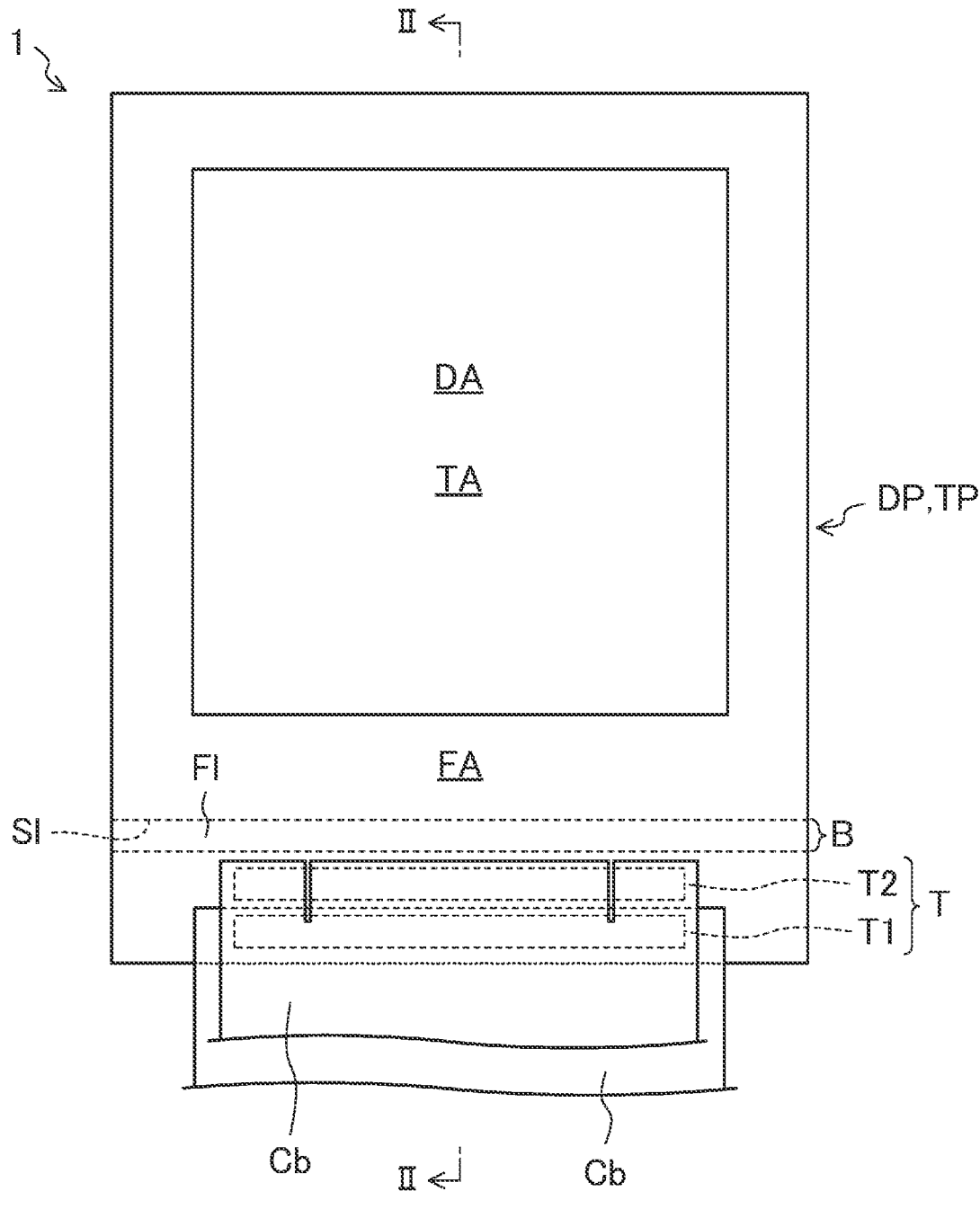
FIG. 1 is a plan view illustrating an example of a schematic configuration of an organic EL display device according to a first embodiment.

Exemplary embodiments will be described in detail below with reference to the drawings. In the embodiments below, an organic EL display device including an organic EL element is described as an example of a display device according to a technique of the present disclosure.

Note that the embodiments below include a statement describing that, above a constituent feature such as a film, layer, or element, another constituent feature such as another film, layer or element is provided or formed. The statement means not only a case where the other constituent feature is found immediately above the constituent feature, but also a case where still another constituent feature such as still another film, layer, or element is provided between the constituent feature and the other constituent feature.

Moreover, the embodiments below includes a statement describing that a constituent feature such as a film, layer, or element is connected to another constituent feature such as another film, layer, or element. Such a statement means that the constituent features are electrically connected together unless otherwise specified. The statement includes not only a case of direct connection but also a case of indirect connection through still another constituent feature such as still another film, layer, or element, unless otherwise departing from the scope of the present disclosure. Furthermore, the statement also includes a case where a constituent feature is integrated with another constituent feature, that is, a portion of a constituent feature constitutes another constituent feature.

In addition, the embodiments below include a statement describing that a constituent feature such as a film, layer, or element is included in the same layer as a layer of another constituent feature such as another film, layer, or element. Such a statement means that both of the constituent features are formed in the same process. A statement describes that a constituent feature is provided below another constituent feature. Such a statement means that the constituent feature is formed in a process preceding the process of the other constituent feature. A statement describes that a constituent feature is provided above another constituent feature. Such a statement means that the constituent feature is formed in a process succeeding the process of the other constituent feature.

Moreover, the embodiments below include a statement describing that a constituent feature such as a film, layer, or element is the same as, or identical to, another constituent feature such as another film, layer, or element. Such a statement means not only a case where the constituent feature is completely the same as, or completely identical to, the other constituent feature, but also a case where the constituent feature is substantially the same as, or substantially identical to, the other constituent feature within production variation and tolerance. In addition, the embodiments describe such terms as "first", "second", and "third". These terms are used to distinguish between the phrases to which these terms are assigned, and shall not limit the number and the order of the phrases.

First Embodiment

Figure 2:
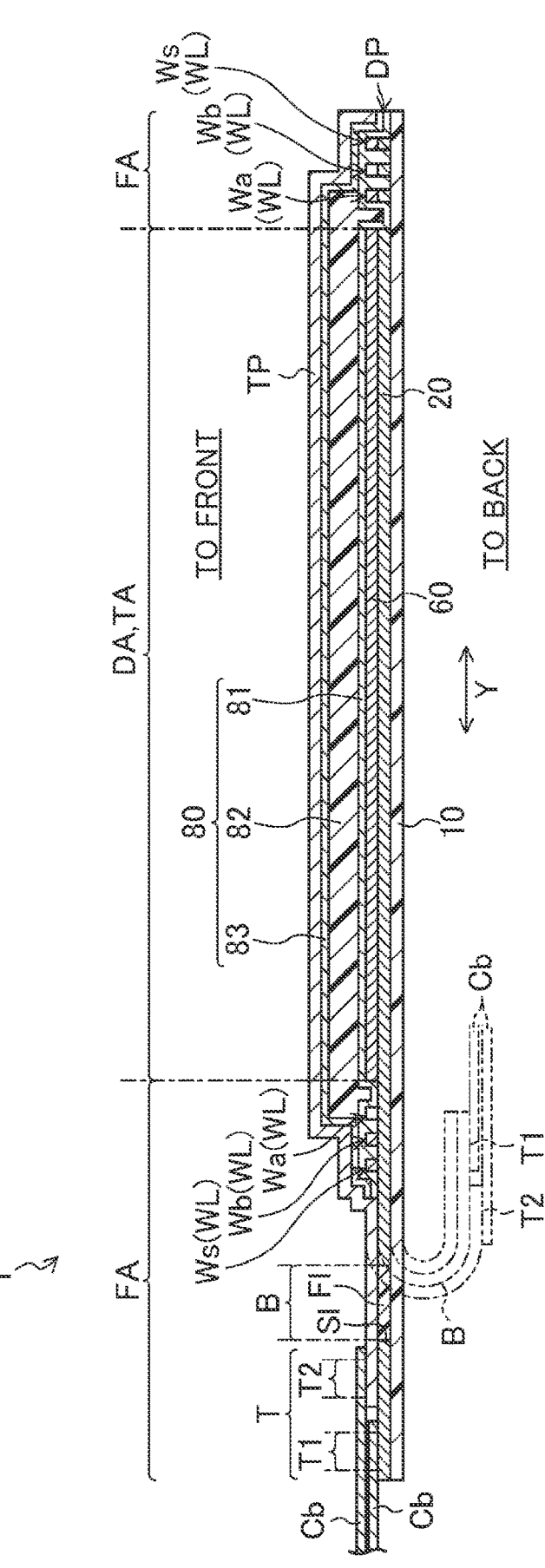
FIG. 2 is a cross-sectional view of the organic EL display device, taken along line II-II in FIG. 1. (Dash-dot-dot-dash lines represent the organic EL display device folded at a folding portion.)

An organic EL display device 1 of this embodiment is used for various appliances such as displays of mobile devices including smart phones and tablet terminals, monitors of personal computers (PCs), and television devices. The organic EL display device 1 illustrated in FIGS. 1 and 2 is a display device provided with an on-cell touch panel TP that allows a user to carry out an input operation by touching the screen.

Configuration of Organic EL Display Device

The organic EL display device 1 has functions of displaying an image and simultaneously detecting a touch position on a screen that displays an image. The organic EL display device 1 includes: a display panel DP having a function of displaying an image; and a touch panel TP having a function of detecting a touch position.

The organic EL display device 1 has: a display region DA; a touch region TA; and a picture-frame region FA. The display region DA is a region for displaying an image. The touch region TA is a region for detecting a position touched with a contact object such as a finger of a user or a stylus. The picture-frame region FA is a region in which no image is displayed or no touch position is detected.

Figure 5:
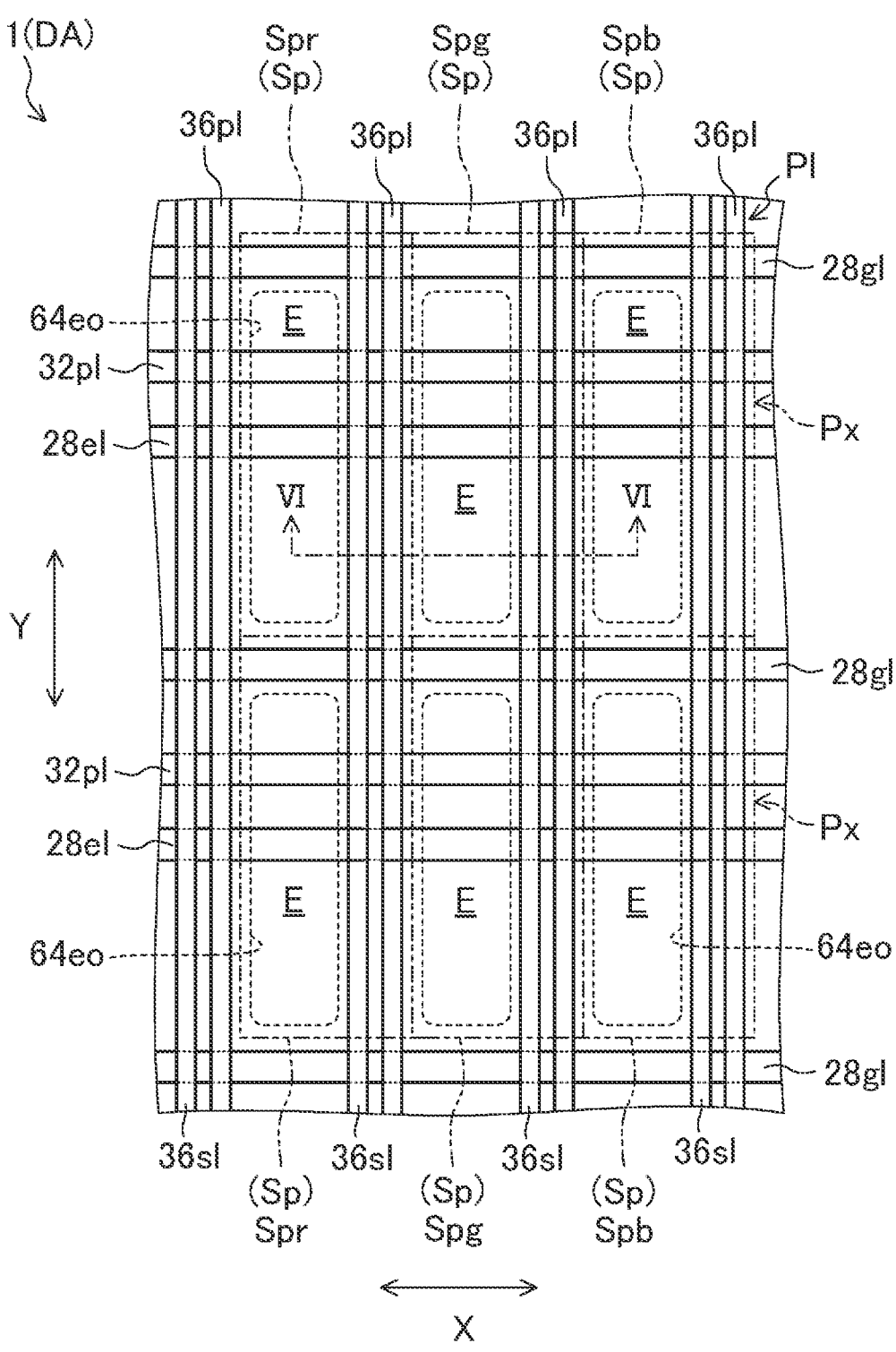
FIG. 5 is a plan view illustrating an example of pixels and various display wires included in a display region of the organic EL display device.

The display region DA is shaped into a rectangle to form a screen. This embodiment discloses the display region DA shaped into a rectangle as an example. The rectangle may include such substantial rectangles as a rectangle having at least one of the sides as an arc-like side, a rectangle having at least one of the corners as a rounded corner, and a rectangle having at least one of the sides as a partially notched side. As illustrated in FIG. 5, the display region DA includes a plurality of pixels Px.

The plurality of pixels Px are arranged in a matrix. Each of the pixels Px includes three subpixels Sp. The three subpixels Sp include a subpixel Spr having a light-emitting region E that emits a red light, a subpixel Spg having a light-emitting region E that emits a green light, and a subpixel Spb having a light-emitting region E that emits a blue light. These three subpixels Spr, Spg, and Spb are arranged, for example, in stripes.

As illustrated in FIGS. 1 and 2, the touch region TA is provided on the screen. The touch region TA is set in the same position as the display region DA, and overlaps with the display region DA in the same size. A shape of the touch region TA corresponds to a shape of the display region DA (rectangular in this example). That is, the touch region TA may be substantially rectangular as described above.

The picture-frame region FA is provided out of the screen, and presents no image. The picture-frame region FA is shaped into a rectangular picture frame. As illustrated in FIGS. 1 to 4, the picture-frame region FA has a portion forming one side and provided with a terminal unit T to be connected to an external circuit (a display control circuit and a touch detecting circuit). The terminal unit T includes a first terminal unit T1 and a second terminal unit T2.

The picture-frame region FA includes a folding portion B between the display region DA and the first terminal unit T1. The folding portion B is foldable around a first direction that is a horizontal direction in FIG. 1. In the folding portion B, a slit Sl is formed in a TFT layer 20 (specifically, a multilayer stack made of a base coat film 22, a gate insulating film 26, a first interlayer insulating film 30, and a second interlayer insulating film 34). The TFT layer 20 will be described later.

The slit Sl is shaped into a groove penetrating the TFT layer 20, and running in a direction in which the folding portion B extends so that the groove exposes a substrate layer 10. In the slit Sl, a filler layer Fl is provided. The slit Sl is filled with the filler layer Fl. The filler layer Fl is formed of an organic resin material such as polyimide resin, acrylic resin, or polysiloxane resin.

When the picture-frame region FA is folded at the folding portion B at an angle of, for example, 180° (in a U-shape), the first terminal unit T1 and the second terminal unit T2 are laid in back of the organic EL display device 1 (represented by the dash-dot-dot-dash line in FIG. 2). To each of the first terminal unit T1 and the second terminal unit T2, a wiring board Cb such as a flexible printed circuit (FPC) is connected.

The picture-frame region FA is provided with a plurality of first lead wires L1 led, in the display panel DP, from the display region DA to the first terminal unit T1. The plurality of first lead wires L1 run from toward the display region DA, go under a first dam wall Wa, a second dam wall Wb, and a spacer wall Ws, and extend out of the picture-frame region FA. Each of the first lead wires L1 includes a lower lead wire 28*hl* and an upper lead wire 36*hl*.

Each first lead wire L1 extends to the first terminal unit T1. The first lead wire L1 is connected to a display control circuit (not shown) through the wiring board Cb in the first terminal unit T1. The display control circuit supplies a signal to a display wire (a source wire 36*sl*) and a drive circuit Dc included in the display panel DP, in order to control image display.

In the picture-frame region FA, the display panel DP (the TFT layer 20) includes a first planarization film 38*pf*. The first planarization film 38*fp* includes a trench G shaped into a picture frame and surrounding the display region DA. The trench G may also be shaped into a substantially C-shape opening toward the first terminal unit T1 in plan view. The trench G penetrates the first planarization film 38*pf* and divides the first planarization film 38*pf* into an inside and an outside of the picture-frame region FA. The trench G prevents water from entering the display region DA out of the picture-frame region FA.

Figure 3:
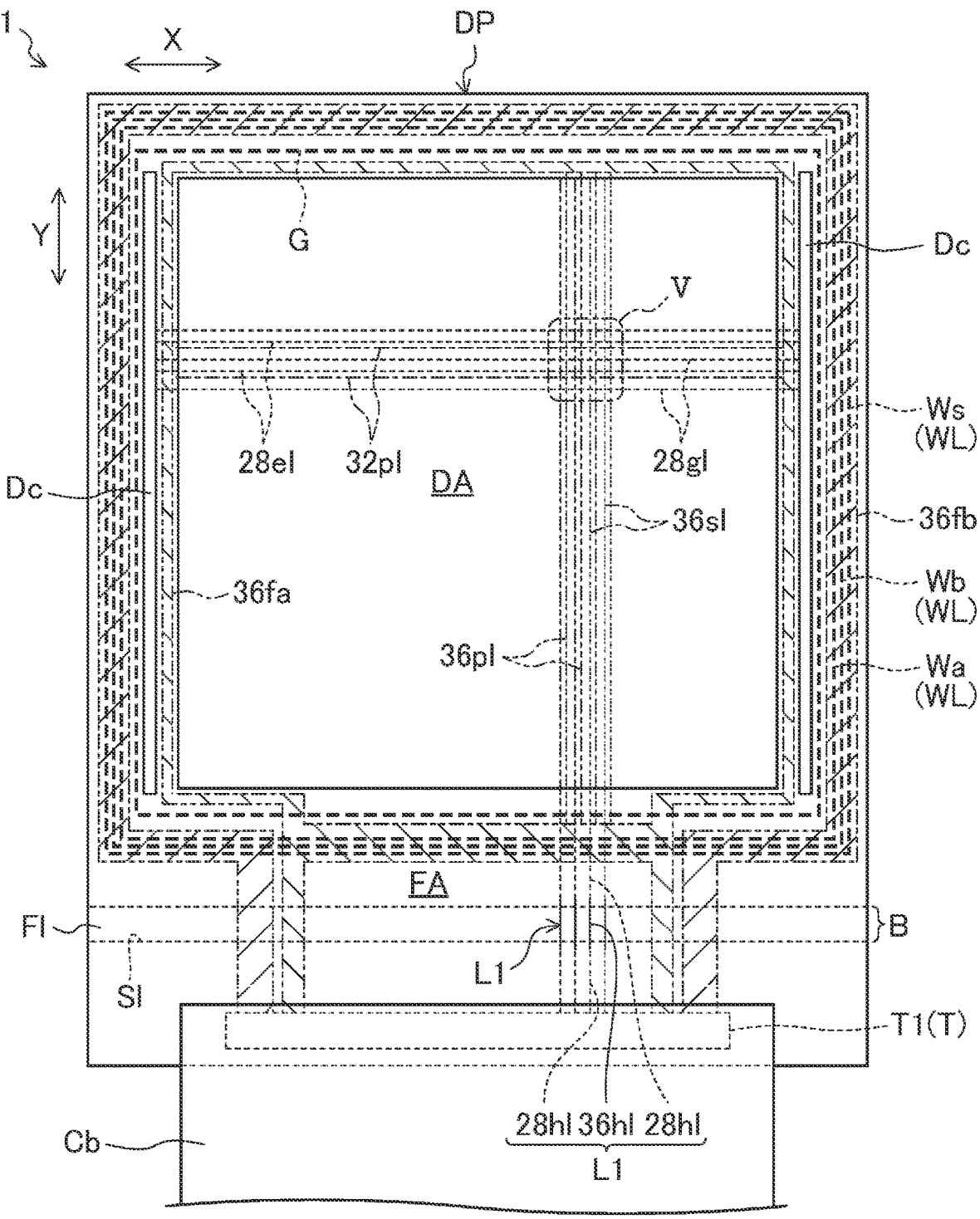
FIG. 3 is a plan view illustrating an example of a schematic configuration of a display panel of the organic EL display device according to the first embodiment.

As illustrated in FIG. 3, in the picture-frame region FA, the drive circuit Dc is monolithically provided to each of the sides (the left and the right side in FIG. 3) adjacent to the side provided with the first terminal unit T1 and the second terminal unit T2. The drive circuit Dc includes a gate driver and an emission driver. The drive circuit Dc is disposed closer to the display region DA than the trench G. The drive circuit Dc or a portion of the drive circuit Dc (the gate driver or the emission driver) may be disposed closer to the outer periphery of the picture-frame region FA than the trench G.

The picture-frame region FA is provided with: a first picture-frame wire 36*fa* (hatched with diagonal lines in an upper left direction in FIG. 3 for the sake of simplicity); and a second picture-frame wire 36*fb* (hatched with diagonal lines in an upper right direction in FIG. 3 for the sake of simplicity). The picture-frame region FA is further provided with: the first dam wall Wa; the second dam wall Wb; and the spacer wall Ws, so as to overlap with the second picture-frame wire 36*fb*. Each of the first dam wall Wa, the second dam wall Wb, and the spacer wall Ws is an example of a wall body WL.

The first picture-frame wire 36*fa* is shaped into a picture frame, and provided closer to the display region DA than the trench G and the drive circuit Dc. The first picture-frame wire 36*fa* runs under the trench G below the first planarization film 38*pf*, and extends toward the first terminal unit T1. The first picture-frame wire 36*fa* is supplied with a high-level power source voltage (ELVDD) at the first terminal unit T1 through the wiring board Cb.

The second picture-frame wire 36*fb* is shaped into a substantial C-shape and provided closer to the outer periphery of the picture-frame region FA than the trench G and the drive circuit Dc. Opposing end portions of the second picture-frame wire 36*fb* extend toward the first terminal unit T1 along the first picture-frame wire 36*fa*. The second picture-frame wire 36*fb* is supplied with a low-level power source voltage (ELVSS) at the first terminal unit T1 through the wiring board Cb.

The first dam wall Wa, the second dam wall Wb, and the spacer wall Ws are, for example, geometrically similar to each other, and are arranged at intervals in a width direction of the picture-frame region FA. The first dam wall Wa is shaped into a picture frame, and extends along an entire outer periphery of the trench G. The second dam wall Wb is shaped into a picture frame, and extends along an entire outer periphery of the first dam wall Wa. The spacer dam wall Ws is shaped into a picture frame, and extends along an entire outer periphery of the second dam wall Wb. The spacer wall Ws is disposed at the outermost periphery of the three walls Wa, Wb, and Ws.

In a process of producing the organic EL display device 1, an organic resin material is applied to form an organic sealing layer 84 included in a sealing film 80. The first dam wall Wa and the second dam wall Wb function as banks to keep the organic resin material from spreading out of the picture-frame region FA. In the process of producing the organic EL display device 1, the spacer wall Ws functions as a spacer to ensure a space between a film forming mask MK and a substrate to be deposited. The film forming mask MK is used for forming an organic EL layer 66 and a common electrode 68*ce*.

Furthermore, the picture-frame region FA is provided with a plurality of second lead wires L2 led, in the touch panel TP, from the touch region TA to the second terminal unit T2. The plurality of second lead wires L2 run from toward the touch region TA, cross the first dam wall Wa, the second dam wall Wb, and the spacer wall Ws, and extend out of the picture-frame region FA.

Each of the second lead wires L2 is connected to a touch detecting circuit (not shown) through the wiring board Cb in the second terminal unit T2. When the touch region TA is touched with a contact object, the touch detecting circuit detects a change in capacitance generated between an electrode (a first detecting electrode 90*de* and a second detecting electrode 110*de* at a touch position) included in the touch panel TP and the contact object.

Display Panel

The display panel DP is an active matrix display panel in which a TFT 50 controls light to be emitted from each of the subpixels Sp. The TFT 50 operates to display an image. As illustrated in FIG. 2, the display panel DP includes: the substrate layer 10; the TFT layer 20 provided above the substrate layer 10; a light-emitting element layer 60 provided above the TFT layer 20; and the sealing film 80 provided above the light-emitting element layer 60.

Substrate Layer

The substrate layer 10 is a base layer of the display panel DP. The substrate layer 10 is flexible. The substrate layer 10 is formed of an organic resin material such as polyimide resin, polyamide, or epoxy resin. The substrate layer 10 may be formed of a multilayer film in which an inorganic insulating layer and a resin layer are stacked on top of each other. The inorganic insulating film may be made of an inorganic insulating material such as silicon oxide, silicon nitride, or silicon oxynitride. The resin layer may be made of the organic resin material described above. To a back surface of the substrate layer 10, a back surface protective film (not shown) is attached.

TFT Layer

Figure 6:
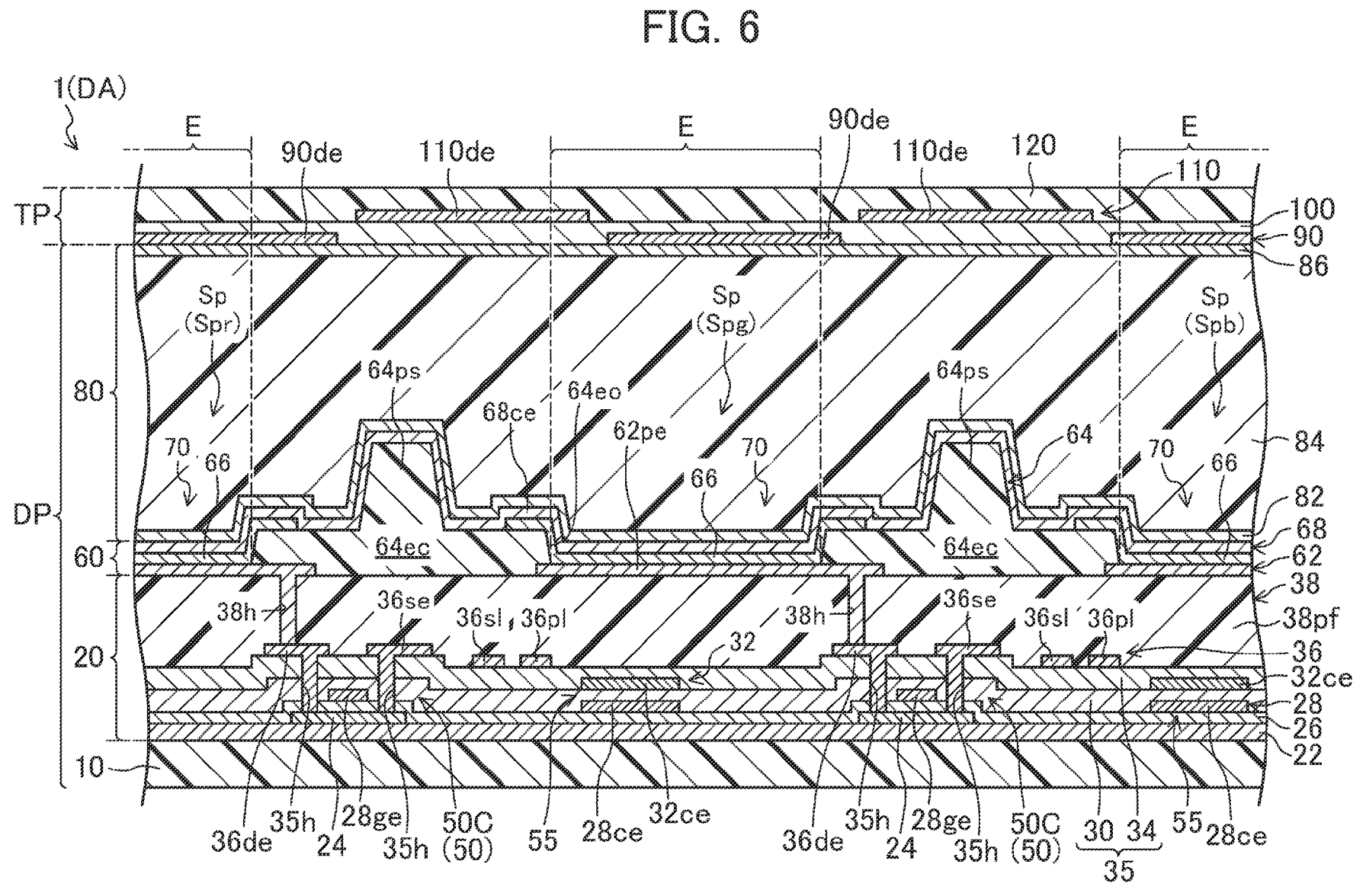

As illustrated in FIG. 6, the TFT layer 20 includes a plurality of the TFTs 50. The TFT layer 20 includes: the base coat film 22; a semiconductor layer 24; the gate insulating film 26; a first conductive layer 28; the first interlayer insulating film 30; a second conductive layer 32; the second interlayer insulating film 34; a third conductive layer 36; and a first resin layer 38; all of which are provided on top of another in the stated order above the substrate layer 10.

The base coat film 22 is provided over a substantially entire surface of the substrate layer 10. The semiconductor layer 24 includes a plurality of semiconductor layers 24 each shaped into an island and provided on the base coat film 22. The semiconductor layer 24 may be provided continuously. The gate insulating film 26 is continuously provided on the base coat film 22 to cover the plurality of semiconductor layers 24. The gate insulating film 26 may be shaped into an island and provided on each semiconductor layer 24.

The first conductive layer 28 is provided on the gate insulating film 26. The first conductive layer 28 includes: a plurality of gate wires 28*gl*; a plurality of emission control wires 28*el*; a plurality of lower lead wires 28*hl*; a plurality of gate electrodes 28*ge*; and a plurality of first capacitive electrodes 28*ce*. These various wires and electrodes are formed of the same material and in the same layer.

The first interlayer insulating film 30 is an insulator disposed between the first conductive layer 28 and the second conductive layer 32. The first interlayer insulating film 30 is provided on the gate insulating film 26 to cover the plurality of gate wires 28*gl*, the plurality of emission control wires 28*el*, the plurality of lower lead wires 28*hl*, the plurality of gate electrodes 28*ge*, and the plurality of first capacitive electrodes 28*ce*.

The second conductive layer 32 is provided on the first interlayer insulating film 30. The second conductive layer 32 includes: a plurality of first power source wires 32*pl*; and a plurality of second capacitive electrodes 32*ce*. These first power source wires 32*pl* and second capacitive electrodes 32*ce* are formed of the same material and in the same layer.

The second interlayer insulating film 34 is an insulator disposed between the second conductive layer 32 and the third conductive layer 36. The second interlayer insulating film 34 is provided on the first interlayer insulating film 30 to cover the plurality of first power source wires 32*pl* and the plurality of second capacitive electrodes 32*ce*. The first interlayer insulating film 30 and the second interlayer insulating film 34 constitute an interlayer insulating film 35. The interlayer insulating film 35 is an insulator disposed between the first conductive layer 28 and the third conductive layer 36.

The third conductive layer 36 is provided on the second interlayer insulating film 34. The third conductive layer 36 includes: a plurality of source wires 36*sl*; a plurality of source electrodes 36*se*; a plurality of drain electrodes 36*de*; a plurality of second power source wires 36*pl*; a plurality of upper lead wires 36*hl*; the first picture-frame wire 36*fa*; and the second picture-frame wire 36*fb*. These various wires and electrodes are formed of the same material and in the same layer.

The first resin layer 38 is provided on the second interlayer insulating film 34. The first resin layer 38 includes: the first planarization film 38pf; and a first wall layer 38wl. These first planarization film 38pf and first wall layer 38wl are formed of the same material and in the same layer. The first planarization film 38pf covers, in the display region DA, various wires and electrodes included in the third conductive layer 36, and planarizes a surface of the TFT layer 20. The first wall layer 38wl is an example of a lower wall layer.

The first wall layer 38wl includes three first wall layers 38wl provided toward the outer periphery of the first planarization film 38pf in the picture-frame region FA. The three first wall layers 38wl are formed into respective picture-frame shapes surrounding the display region DA, and arranged to overlap with each other at intervals in the width direction of the picture-frame region FA. The three first wall layers 38wl form lower portions of the first dam wall Wa, the second dam wall Wb, and the spacer wall Ws. In this example, the first wall layer 38wl included in the first dam wall Wa, the first wall layer 38wl included in the second dam wall Wb, and the first wall layer 38wl included in the spacer wall Ws are the same in thickness.

The base coat film 22, the gate insulating film 26, the first interlayer insulating film 30, and the second interlayer insulating film 34 are made of an inorganic insulating material such as, for example, silicon oxide, silicon nitride, or silicon oxynitride. The base coat film 22, the gate insulating film 26, the first interlayer insulating film 30, and the second interlayer insulating film 34 are either monolayer films or multilayer films made of such inorganic insulating materials.

The semiconductor layer 24 is formed of, for example, low-temperature polycrystalline silicon (LTPS). The semiconductor layer 24 may be made of an oxide semiconductor such as indium gallium zinc oxide (In—Ga—Zn—O), or of another semiconductor material. The first planarization film 38pf and the first wall layer 38wl are made of, for example, such an organic resin material as polyimide resin or acrylic resin. Alternatively, the first planarization film 38pf and the first wall layer 38wl are made of a polysiloxane-based spin-on-glass (SOG) material.

Exemplary materials of various wires and electrodes in the first conductive layer 28, the second conductive layer 32, and the third conductive layer 36 include such metal materials as aluminum (Al), tungsten (W), molybdenum (Mo), tantalum (Ta), chromium (Cr), titanium (Ti), and copper (Cu). These various wires and electrodes are monolayer films or multilayer films made of such metal materials.

Display Wire

As illustrated in FIG. 5, in the display region DA, the plurality of gate wires 28gl are spaced apart from one another in a second direction Y perpendicular to a first direction X, and extend in parallel with one another in the first direction X. Each of the gate wires 28gl is a display wire to transmit a gate signal. A gate wire 28gl is provided for each row of the subpixels Sp. Each of the gate wires 28gl is connected to a gate driver of the drive circuit Dc.

In the display region DA, the plurality of emission control wires 28el are spaced apart from one another in the second direction Y, and extend in parallel with one another in the first direction X. Each of the emission control wires 28el is a wire to transmit an emission control signal. An emission control wire 28el is provided for each row of the subpixels Sp. Each emission control wire 28el is connected to an emission driver of the drive circuit Dc.

In the display region DA, the plurality of source wires 36sl are spaced apart from one another in the first direction X, and extend in parallel with one another in the second direction Y. Each of the source wires 36sl is a wire to transmit a source signal. A source wire 36sl is provided for each column of the subpixels Sp. Each source wire 36sl is connected to a first lead wire L1, and is connected to the display control circuit through the first terminal unit T1.

In the display region DA, the plurality of first power source wires 32pl are spaced apart from one another in the second direction Y, and extend in parallel with one another in the first direction X. In the display region DA, the plurality of second power source wires 36pl are spaced apart from one another in the first direction X, and extend in parallel with one another in the second direction Y. The first power source wires 32pl are connected to the respective second power source wires 36pl through contact holes (not shown) formed in the second interlayer insulating film 34. These first power source wires 32pl and second power source wires 36pl form power source wires Pl. The power source wires Pl apply a predetermined high-level power source voltage (ELVDD).

As illustrated in FIG. 3, in the picture-frame region FA, the plurality of lower lead wires 28hl each have one portion provided between the display region DA and the folding portion B, and another portion provided between the folding portion B and the first terminal unit T1. The portions are spaced apart from one another in the first direction X, and extend in parallel with one another in the second direction Y. Each of the lower lead wires 28hl, which is positioned closer to the display region DA than the folding portion B, is connected to a corresponding one of the source wires 36sl through a contact hole (not shown) formed in the interlayer insulating film 35.

In the picture-frame region FA, the plurality of upper lead wires 36hl are spaced apart from one another in the first direction X, provided on the filler layer Fl to cross the folding portion B, and laid in parallel with one another in the second direction Y. Each upper lead wire 36hl is connected through a contact hole (not shown) formed in the interlayer insulating film 35 to a corresponding lower lead wire 28hl positioned closer to the display region DA than the folding portion B and to a corresponding lower lead wire 28hl positioned closer to the first terminal unit T1 than the folding portion B.

Display Electrode, TFT, and Capacitor

Two or more of the gate electrodes 28ge, two or more of the source electrodes 36se, and two or more of the drain electrodes 36de are provided for each of the subpixels Sp. A gate electrode 28ge, a source electrode 36se and a drain electrode 36de constitute a TFT 50, as illustrated in FIG. 6. Two or more of the TFTs 50 are provided for each of the subpixels Sp. Any of the plurality of TFTs 50 is a top gate TFT.

Each TFT50 includes: the semiconductor layer 24; the gate insulating film 26; the gate electrode 28ge; the interlayer insulating film 35; the source electrode 36se; and the drain electrode 36de. The source electrode 36se and the drain electrode 36de are: separated from each other; positioned to sandwich a region (an intrinsic region) included in the semiconductor layer 24 and overlapping with the gate electrode 28ge; and connected to different portions (conduction regions) of the semiconductor layer 24 through contact holes 35h formed in the interlayer insulating film 35.

At least one first capacitive electrode 28ce and at least one second capacitive electrode 32ce are provided for each of the subpixels Sp. The first capacitive electrode 28ce and the second capacitive electrode 32ce constitute a capacitor 55. At least one capacitor 55 is provided for each of the subpixels Sp. The capacitor 55 is an element for holding data. The capacitor 55 includes: the first capacitive electrode 28_ce_; the first interlayer insulating film 30; and the second capacitive electrode 32_ce_. The first capacitive electrode 28_ce_ and the second capacitive electrode 32_ce_ overlap with each other through the first interlayer insulating film 30.

Light-Emitting Element Layer

The light-emitting element layer 60 is provided on the TFT layer 20. That is, the light-emitting element layer 60 is supported by the substrate layer 10 through the TFT layer 20. The light-emitting element layer 60 includes a plurality of organic electroluminescence (EL) elements 70. The organic EL elements 70 are an example of light-emitting elements. The light-emitting element layer 60 includes: a fourth conductive layer 62; a second resin layer 64; the organic EL layer 66; and a fifth conductive layer 68, all of which are provided in the stated order above the first resin layer 38.

The fourth conductive layer 62 includes: a plurality of pixel electrodes 62_pe_; and a connecting conductive film 62_cf_. The pixel electrodes 62_pe_ and the connecting conductive film 62_cf_ are formed in the same layer and of the same material. Each of the pixel electrodes 62_pe_ is provided to a corresponding one of the subpixels Sp in the display region DA. Each pixel electrode 62_pe_ functions as an anode to inject holes into the organic EL layer 66. The pixel electrode 62_pe_ is reflective to light.

Examples of materials forming the pixel electrode 62_pe_ include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn).

Furthermore, the pixel electrode 62_pe_ may be formed of, for example, an alloy of astatine (At) and astatine oxide (AtO$_2$). Moreover, a material of the pixel electrode 62_pe_ may be a conductive oxide such as, for example, tin oxide (SnO), zinc oxide (ZnO), indium tin oxide (ITO), or indium zinc oxide (IZO). The pixel electrode 62_pe_ is preferably formed of a material having a large work function, to improve efficiency in injection of the holes into the organic EL layer 66. In addition, the pixel electrode 62_pe_ may be formed of a plurality of layers made of the above materials and stacked on top of another.

The connecting conductive film 62_cf_ is a conductive film to connect the common electrode 68_ce_ and the second picture-frame wire 36_fb_ together. The connecting conductive film 62_cf_ is shaped into a C-shape opening toward the terminal unit T in the picture-frame region FA. The connecting conductive film 62_cf_ is included in the first dam wall Wa, the second dam wall Wb, and the spacer wall Ws, and disposed between the first wall layers 38_wl_ and second wall layers 64_wl_. The connecting conductive film 62_cf_ has: an inner peripheral portion overlapping with, and connected to, the common electrode 68_ce_; and an outer peripheral portion overlapping with, and connected to, the second picture-frame wire 36_fb_ between the first wall layers 38_wl_ adjacent to each other.

The second resin layer 64 includes: an edge cover 64_ec_; a photo spacer 64_ps_; and a second wall layer 64_wl_. The edge cover 64_ec_, the photo spacer 64_ps_, and the second wall layer 64_wl_ are formed in the same layer and of the same material. Exemplary materials of the edge cover 64_ec_, the photo spacer 64_ps_, and the second wall layer 64_wl_ include either organic resin materials such as polyimide resin, acrylic resin and polysiloxane resin, or a polysiloxane-based SOG material. The second wall layer 64_wl_ is an example of an upper wall layer.

The edge cover 64_ec_ partitions adjacent pixel electrodes 62_pe_. The edge cover 64_ec_ is formed in a grid pattern as a whole, and covers a peripheral edge portion of each pixel electrode 62_pe_. The edge cover 64_ec_ includes an opening 64_eo_ formed to expose each of the pixel electrodes 62_pe_. The edge cover 64_ec_ has a surface partially forming a plurality of the photo spacers 64_ps_. The photo spacers 64_ps_ ensure a space between the film forming mask MK and a substrate on which a film is to be deposited. The film forming mask MK is used for forming the organic EL layer 66 and the common electrode 68_ce_.

The second wall layers 64_wl_ are included in the picture-frame region FA, and provided above the respective first wall layers 38_wl_ and the connecting conductive film 62_cf_. That is, three second wall layers 64_wl_ are provided toward the outer periphery of the first planarization film 38_pf_. The three second wall layers 64_wl_ are formed into respective picture-frame shapes surrounding the display region DA, and arranged to overlap with each other at intervals in the width direction of the picture-frame region FA.

The three second wall layers 64_wl_ form upper portions of the first dam wall Wa, the second dam wall Wb, and the spacer wall Ws. The second wall layer 64_wl_ included in the first dam wall Wa and the second wall layer 64_wl_ included in the second dam wall Wb are the same in thickness. The second wall layer 64_wl_ included in the spacer dam wall Ws has a portion provided with a protruding portion 64_cp_. The protruding portion 64_cp_ is thicker than the second wall layers 64_wl_ included in the respective first dam wall Wa and second dam wall Wb.

Figure 7:
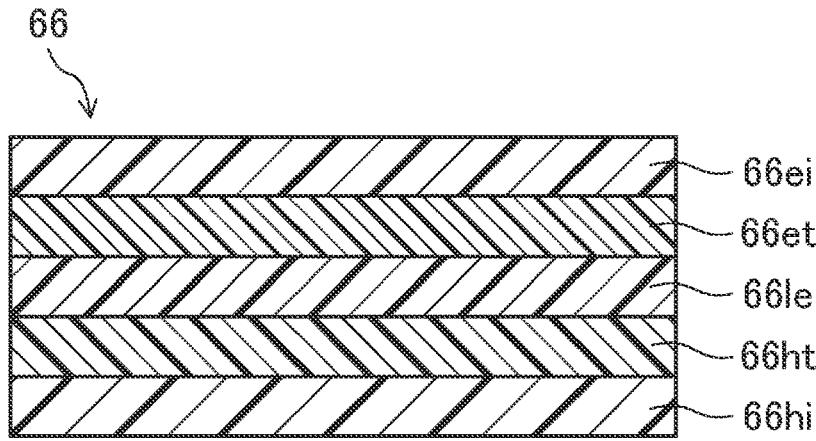
FIG. 7 is a cross-sectional view illustrating an example of a multilayer structure of an organic EL layer included in the organic EL display device.

The organic EL layer 66 is an example of a light-emitting functional layer. The organic EL layer 66 is provided on an individual pixel electrode 62_pe_ in each opening 64_eo_ of the edge cover 64_ec_. As illustrated in FIG. 7, the organic EL layer 66 includes a plurality of functional layers. The plurality of functional layers are: a hole injection layer 66_hi_; a hole transport layer 66_ht_; a light-emitting layer 66_le_, an electron transport layer 66_et_; and an electron injection layer 66_ei_, all of which are provided in the stated order above the pixel electrode 62_pe_. Some of these functional layers may be provided monolithically in common to the plurality of subpixels Sp.

The hole injection layer 66_hi_ is also referred to as an anode buffer layer. The hole injection layer 66_hi_ brings energy levels of the pixel electrode 62_pe_ and the organic EL layer 66 closer to each other to improve efficiency in injection of the holes from the pixel electrode 62_pe_ to the organic EL layer 66. Exemplary materials of the hole injection layer 66_hi_ include: a triazole derivative; an oxadiazole derivative; an imidazole derivative; a polyarylalkane derivative; a pyrazoline derivative; a phenylenediamine derivative; an oxazole derivative; a styrylanthracene derivative; a fluorenone derivative; a hydrazone derivative; and a stilbene derivative.

The hole transport layer 66_ht_ improves efficiency in transportation of the holes to the light-emitting layer 66_le_. Exemplary materials of the hole transport layer 66_ht_ include: a porphyrin derivative; an aromatic tertiary amine compound; a styrylamine derivative; polyvinyl carbazole; poly-p-phenylenevinylene; polysilane; a triazole derivative; an oxadiazole derivative; an imidazole derivative, a polyaryl-alkane derivative; a pyrazoline derivative; a pyrazolone derivative; a phenylenediamine derivative; an arylamine derivative; an amine-substituted chalcone derivative; an oxazole derivative; a styrylanthracene derivative; a fluorenone derivative; a hydrazone derivative; a stilbene derivative; hydrogenated amorphous silicon; hydrogenated amorphous silicon carbide; zinc sulfide, and zinc selenide.

When a current is applied with the pixel electrode 62*pe* and the common electrode 68*ce*, the light-emitting layer 66*le* recombines the holes injected from the pixel electrode 62*pe* and the electrons injected from the common electrode 68*ce* to emit light. The light-emitting layer 66*le* is formed of a different material, depending on, for example, a color (red, green, or blue) of the light to be emitted from the organic EL element 70 of an individual subpixel Sp.

Exemplary materials of the light-emitting layer 66*le* include: a metal oxinoid compound [8-hydroxyquinoline metal complex]; a naphthalene derivative; an anthracene derivative; a diphenylethylene derivative; a vinylacetone derivative; a triphenylamine derivative; a butadiene derivative; a coumarin derivative; a benzoxazole derivative; an oxadiazole derivative; an oxazole derivative; a benzimidazole derivative; a thiadiazole derivative; a benzothiazole derivative; a styryl derivative; a styrylamine derivative; a bisstyrylbenzene derivative; a trisstyrylbenzene derivative; a perylene derivative; a perinone derivative; an aminopyrene derivative; a pyridine derivative; a rhodamine derivative; an aquizine derivative; phenoxazone, a quinacridone derivative; rubrene; poly-p-phenylenevinylene, and polysilane.

The electron transport layer 66*et* improves efficiency in transportation of the electrons to the light-emitting layer 66*le*. Exemplary materials of the electron transport layer 66*et* include: an oxadiazole derivative; a triazole derivative; a benzoquinone derivative; a naphthoquinone derivative; an anthraquinone derivative; a tetracyanoanthraquinodimethane derivative; a diphenoquinone derivative; a fluorenone derivative; a silole derivative; and a metal oxynoid compound.

The electron injection layer 66*ei* is also referred to as an anode buffer. The electron injection layer 66*ei* brings energy levels of the common electrode 68*ce* and the organic EL layer 66 closer to each other to improve efficiency in injection of the electrons from the common electrode 68*ce* to the organic EL layer 66. Exemplary materials of the electron injection layer 66*ei* include: inorganic alkali compounds such as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$); and strontium oxide (SrO).

The fifth conductive layer 68 includes the common electrode 68*ce*. The common electrode 68*ce* is monolithically provided in common to the plurality of subpixels Sp. The common electrode 68*ce* is provided on the organic EL layer 66, and covers the edge cover 64*ec*. The common electrode 68*ce* overlaps with the pixel electrodes 62*pe* through the organic EL layer 66. The common electrode 68*ce* functions as a cathode to inject the electrons into the organic EL layer 66. The common electrode 68*ce* is transparent to light.

Exemplary materials of the common electrode 68*ce* include: silver (Ag); aluminum (Al); vanadium (V); calcium (Ca); titanium (Ti); yttrium (Y); sodium (Na); manganese (Mn); indium (In); magnesium (Mg); lithium (Li); ytterbium (Yb); and lithium fluoride (LiF).

Furthermore, the common electrode 68*ce* may be formed of an alloy such as: magnesium (Mg) and copper (Cu); magnesium (Mg) and silver (Ag); sodium (Na) and potassium (K); astatine (At) and astatine oxide ($AtO_2$); lithium (Li) and aluminum (Al); lithium (Li), calcium (Ca), and aluminum (Al); or lithium fluoride (LiF), calcium (Ca), and aluminum (Al).

Moreover, a material of the common electrode 68*ce* may be a conductive oxide such as, for example, tin oxide (SnO), zinc oxide (ZnO), indium tin oxide (ITO), or indium zinc oxide (IZO). The common electrode 68*ce* is preferably formed of a material having a small work function, to improve efficiency in injection of the electrons into the organic EL layer 66. In addition, the common electrode 68*ce* may be formed of a plurality of layers made of the above conductive materials and stacked on top of another.

Organic EL Elements

The organic EL elements 70 are provided for the respective subpixels Sp. Any of the plurality of organic EL elements 70 is a top-emission organic EL element. Each of the organic EL elements 70 has the pixel electrode 62*pe*, the organic EL layer 66, and the common electrode 68*ce*. In the organic EL element 70, when a current is applied between the pixel electrode 62*pe* and the common electrode 68*ce*, the organic EL layer 66 emits light. The organic EL element 70 emits light in a region corresponding to each of the openings 64*eo* of the edge cover 64*ec*.

Each pixel electrode 62*pe* is connected to the drain electrode 36*de* of a predetermined TFT50 (a third TFT50C) in the corresponding subpixel Sp, through a contact hole 38*h* formed in the first planarization film 38*pf*. The organic EL layer 66 is disposed between the pixel electrode 62*pe* and the common electrode 68*ce*. The common electrode 68*ce* extends to the picture-frame region FA, and connects to the connecting conductive film 62*cf* in the picture-frame region FA. Hence, through the connecting conductive film 62*cf*, the common electrode 68*ce* connects to the second picture-frame wire 36*fb* between the first planarization film 38*pf* and the first dam wall Wa, between the first dam wall Wa and the second dam Wb, and between the second dam wall Wb and the spacer wall Ws.

Pixel Circuit

Figure 8:
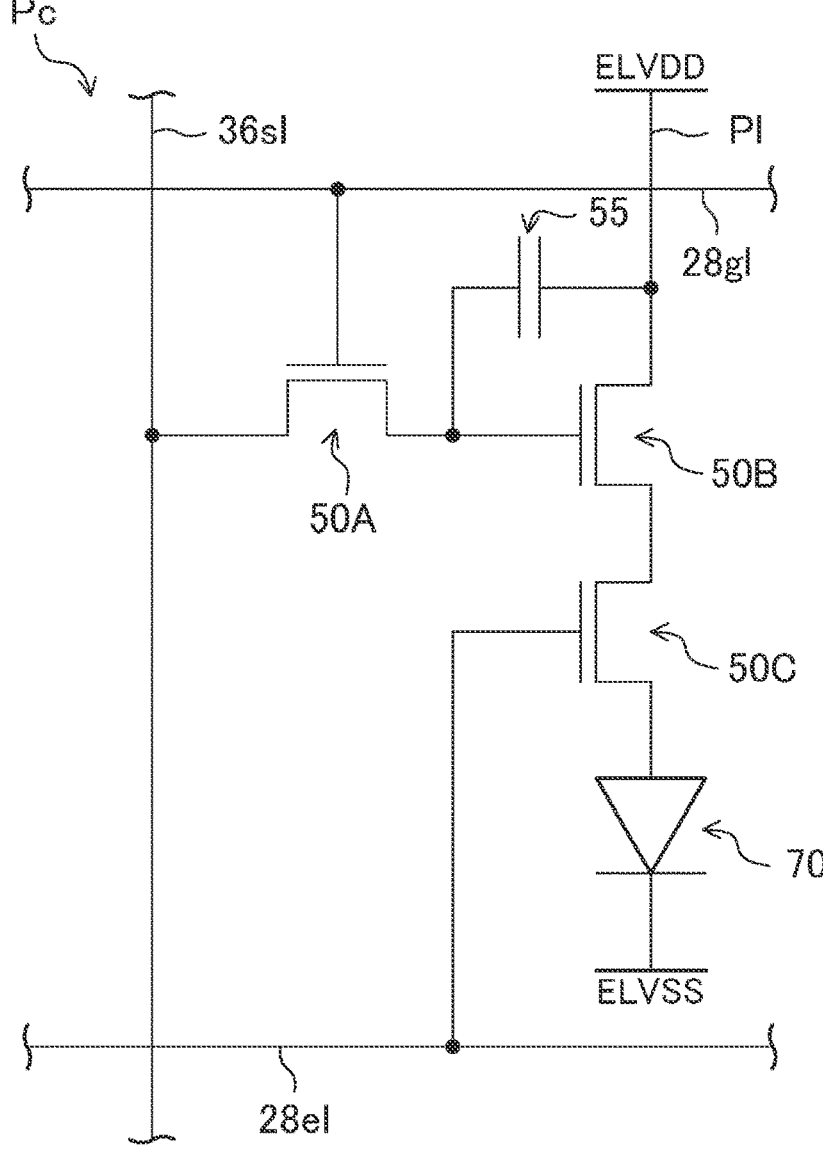
FIG. 8 is an equivalent circuit diagram illustrating an example of a pixel circuit of the organic EL display device.

The plurality of TFTs 50, a capacitor 55, and the organic EL element 70 are provided for each of the subpixels Sp, and constitute a pixel circuit Pc as illustrated in FIG. 8. The pixel circuit Pc controls light to be emitted from the organic EL element 70 provided in the corresponding subpixel Sp, in accordance with: a gate signal to be supplied to a gate wire 28*gl*; an emission signal to be supplied to an emission control wire 28*el*; a source signal to be supplied to a source wire 36*sl*; a high-level power source voltage to be supplied to the power source wire Pl; and a low-level power source voltage to be supplied to the common electrode 68*ce*.

The plurality of TFTs 50 constituting the pixel circuit Pc include: a first TFT 50A; a second TFT 50B; and a third TFT 50C. In each subpixel Sp, the first TFT 50A is connected to the corresponding gate wire 28*gl*, source wire 36*sl*, and second TFT 50B. In each subpixel Sp, the second TFT 50B is connected to the corresponding first TFT 50A, power source wire Pl, and third TFT 50C. In the subpixel Sp, the third TFT 50C is connected to the corresponding second TFT 50B, emission control wire 28*el*, and organic EL element 70. In each subpixel Sp, the capacitor 55 is connected to the corresponding first TFT 50A, second TFT 50B, and power source wire Pl.

Sealing Film

As illustrated in FIGS. 2 and 6, the sealing film 80 is provided on the light-emitting element layer 60 to cover the plurality of organic EL elements 70. The sealing film 80 protects each organic EL element 70 (in particular, the organic EL layer 66) from, for example, water and oxygen. The sealing film 80 includes: a first inorganic sealing layer 82; an organic sealing layer 84; and a second inorganic sealing layer 86, all of which are provided in the stated order above the light-emitting element layer 60.

The first inorganic sealing layer 82 covers: the common electrode 68_ce_ in the display region DA; and the first dam wall Wa, the second dam wall Wb, and the spacer wall Ws in the picture-frame region F. The first inorganic sealing layer 82 extends toward an outer periphery of the spacer wall Wb. The organic sealing layer 84 is provided on the first inorganic sealing layer 82 behind the second dam wall Wb. The organic sealing layer 84 may also be provided between the second dam wall Wb and the spacer wall Ws.

The second inorganic sealing layer 86 covers the organic sealing layer 84, and extends toward the outer periphery of the spacer wall Ws. The second inorganic sealing layer 86 has a peripheral edge portion overlapping with a peripheral edge portion of the first inorganic sealing layer 82, toward an outer periphery of the second dam wall Wb. Hence, the organic sealing layer 84 is wrapped with, and contained between, the first inorganic sealing layer 82 and the second inorganic sealing layer 86.

Each of the first inorganic sealing layer 82 and the second inorganic sealing layer 86 is formed of such an inorganic insulating material as, for example, silicon oxide, silicon nitride, or silicon oxynitride. The organic sealing layer 84 is formed of such an organic resin material as, for example, acrylic resin, epoxy resin, silicone resin, polyurea resin, parylene resin, polyimide resin, or polyamide resin.

Touch Panel

As illustrated in FIG. 6, the touch panel TP is a projected capacitive touch panel. The touch panel TP includes: a sixth conductive layer 90 provided above the display panel DP; an interlayer insulating film 100 provided above the sixth conductive layer 90; a seventh conductive layer 110 provided above the interlayer insulating film 100; and an overcoat film 120 provided above the seventh conductive layer 110.

The sixth conductive layer 90 is provided on the sealing film 80. The sixth conductive layer 90 includes: a plurality of the first detecting electrodes 90_de_; a plurality of first connecting wires 90_cl_; and a plurality of lower lead wires 90_hl_. These first detecting electrodes 90_de_, first connecting wires 90_cl_, and lower lead wires 90_hl_ are formed of the same material and in the same layer.

The interlayer insulating film 100 is provided on the sixth conductive layer 90. The interlayer insulating film 100 is an insulator disposed between the sixth conductive layer 90 and the seventh conductive layer 110. The interlayer insulating film 100 is provided to cover: the plurality of first detecting electrodes 90_de_ and the plurality of first connecting wires 90_cl_ in the touch region TA; and the plurality of lower lead wires 90_hl_ in the picture-frame region FA other than the second terminal unit T2. The interlayer insulating film 100 may be provided to cover only each of the first connecting wires 90_c_ and the surroundings of the first connecting wires 90_c_.

The seventh conductive layer 110 is provided on the interlayer insulating film 100. The seventh conductive layer 110 includes: a plurality of the second detecting electrodes 110_de_; a plurality of second connecting wires 110_cl_; and a plurality of upper lead wires 110_hl_. These second detecting electrodes 110_de_, second connecting wires 110_cl_, and upper lead wires 110_hl_ are formed in the same layer and of the same material.

The overcoat film 120 is provided on the seventh conductive layer 110. The overcoat film 120 is provided to cover: the plurality of second detecting electrodes 110_de_ and the plurality of second connecting wires 110_cl_ in the touch region TA; and the plurality of upper lead wires 110_hl_ in the picture-frame region FA other than the second terminal unit T2.

Various wires and electrodes included in the sixth conductive layer 90 and the seventh conductive layer 110 are made of a light-transparent conductive oxide such as, for example, indium tin oxide (ITO) or indium zinc oxide (IZO). These various wires and electrodes are monolayer films or multilayer films made of those conductive oxides.

The interlayer insulating film 100 is made of an inorganic insulating material such as, for example, silicon oxide, silicon nitride, or silicon oxynitride. The interlayer insulating film 100 is a monolayer film or a multilayer film made of those inorganic insulating materials. The overcoat film 120 is made of, for example, a light-transparent organic resin material such as an acrylic resin.

Electrodes for Detecting Touch Position

Figure 4:
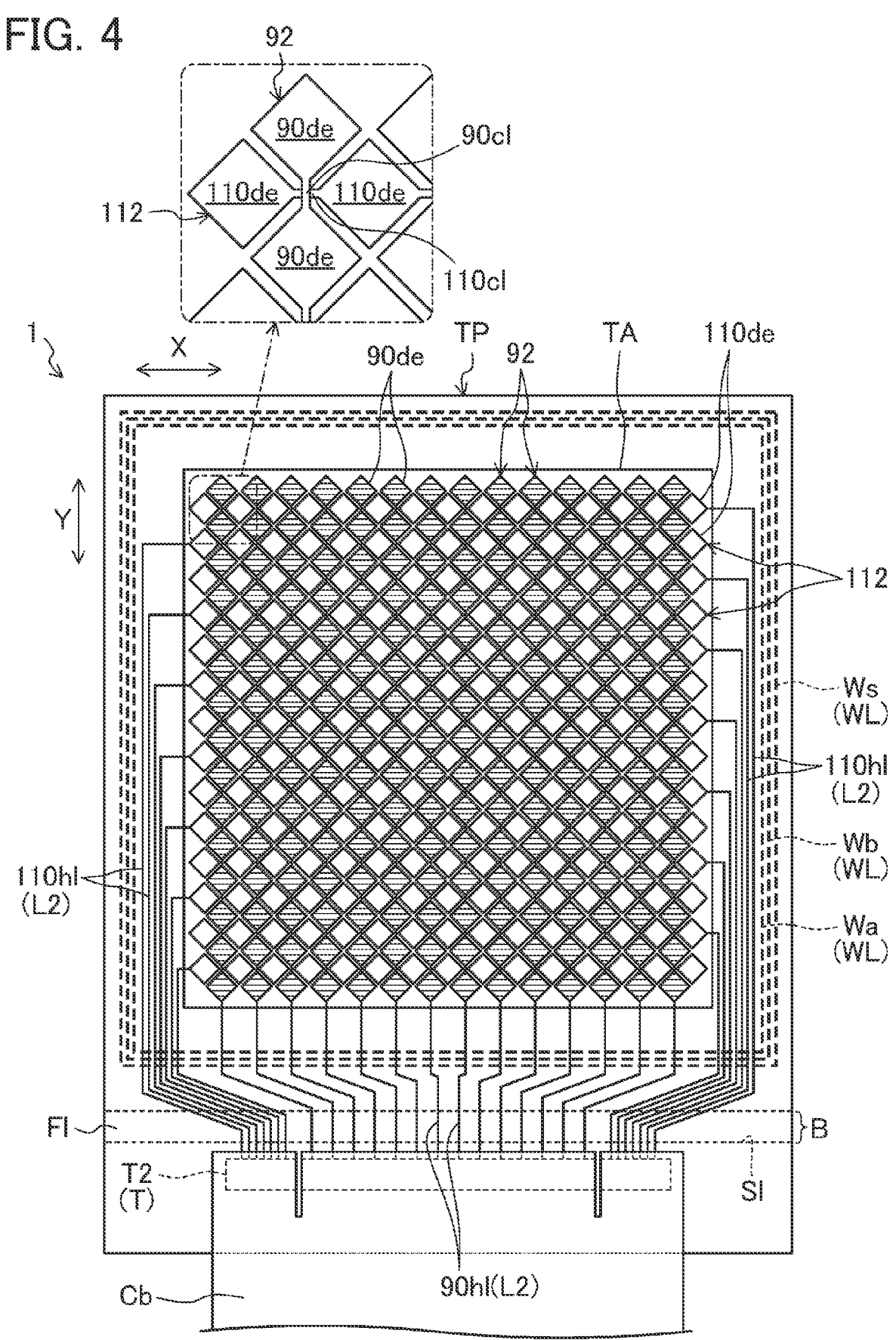
FIG. 4 is a plan view illustrating an example of a schematic configuration of a touch panel of the organic EL display device according to the first embodiment. Together with the touch panel, the plan view illustrates a first dam wall, a second dam wall, and a spacer wall.

The first detecting electrodes 90_de_ and the second detecting electrodes 110_de_ are electrodes for detecting touch positions. As illustrated in FIG. 4, the plurality of first detecting electrodes 90_de_ are arranged in a matrix in the touch region TA. The plurality of second detecting electrodes 110_de_ are also arranged in a matrix in the touch region TA. The first detecting electrodes 90_de_ and the second detecting electrodes 110_de_ are alternately arranged in oblique directions with respect to the first direction X and the second direction Y.

Each of the first detecting electrodes 90_de_ is shaped into, for example, a rhombus. Corners of the first detecting electrodes 90_de_, adjacent to each other in the first direction X and the second direction Y, face each other. Hence, the corners of the first detecting electrodes 90_de_ adjacent to each other in the second direction Y are connected together through the first connecting wires 90_cl_. The plurality of first detecting electrodes 90_de_ arranged in the second direction Y are connected to each other to form a first electrode column 92. The first electrode column 92 includes a plurality of first electrode columns 92 arranged in the first direction X.

Each of the second detecting electrodes 110_de_ is also shaped into, for example, a rhombus. Corners of the second detecting electrodes 110_de_, adjacent to each other in the first direction X and the second direction Y, face each other. Hence, the corners of the second detecting electrodes 110_de_ adjacent to each other in the first direction X are connected together through the second connecting wires 110_cl_. The plurality of second detecting electrodes 110_de_ arranged in the first direction X are connected to each other to form a second electrode column 112. The second electrode column 112 includes a plurality of second electrode columns 112 arranged in the second direction Y.

The lower lead wires 90_hl_ are provided for the respective first electrode columns 92, and connected to the first detecting electrodes 90_de_ forming the corresponding first electrode columns 92. Each of the lower lead wires 90_hl_ is lead to the second terminal unit T2 from a portion forming a side of the picture-frame region FA toward the second terminal unit TA.

The upper lead wires 110_hl_ are provided for the respective second electrode columns 112, and connected to the second detecting electrodes 110_de_ forming the corresponding second electrode columns 112. Each of the upper lead wires 110_hl_ is routed from the touch region TA to the second terminal unit T2, through a portion forming one side or another side (the left side or the right side in the example illustrated in FIG. 4) of the picture-frame region FA in the first direction X. The upper lead wires 110_hl_ connected to the adjacent second electrode columns 112 are led toward different sides of the picture-frame region FA.

The upper lead wires 110*hl* and the lower lead wires 90*hl* are the second lead wires L2. Each of the second lead wires L2 intersects with the first dam wall Wa, the second dam wall Wb, and the spacer wall Ws, and extends on a sealing film (the second inorganic sealing layer 86) to cross the spacer wall Ws.

First Dam Wall, Second Dam Wall, and Spacer Wall

Figure 11:
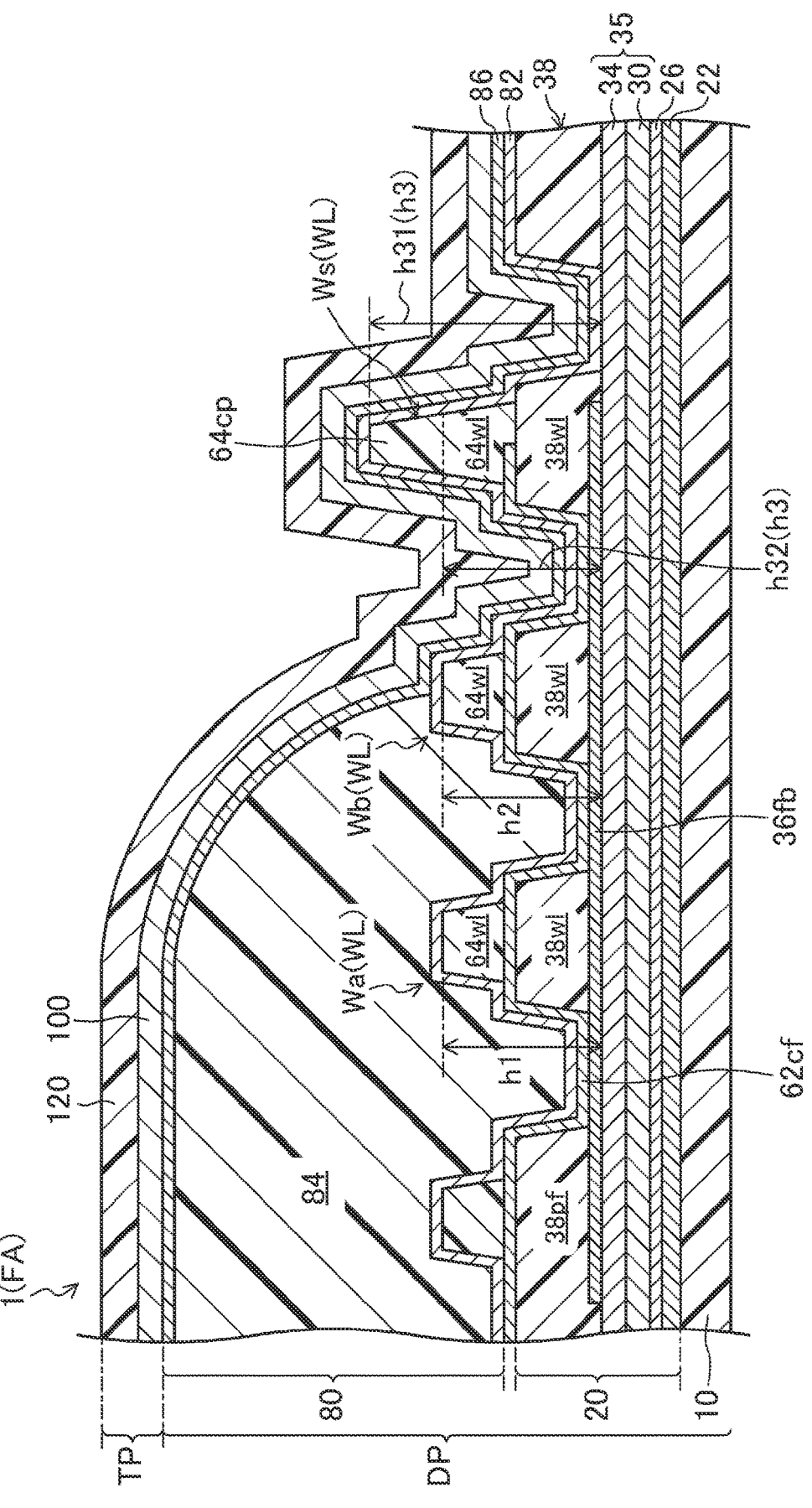
FIG. 11 is a cross-sectional view of the organic EL display device, taken along line XI-XI in FIG. 10.

As illustrated in FIG. 11, each of the first dam wall Wa, the second dam wall Wb, and the spacer wall Ws includes the first wall layer 38*wl* and the second wall layer 64*wl*. The first wall layer 38*wl* is supported by the substrate layer 10 through a lower portion of the TFT layer 20. The second wall layer 64*wl* extends on the first wall layer 38*wl*. The second wall layer 64*wl* is narrower than the first wall layer 38*wl*. A height h1 of the first dam wall Wa and a height h2 of the second dam wall Wb are designed so that most of an organic resin material forming the organic sealing layer 84 is blocked up to the second dam wall Wb.

Figure 9:
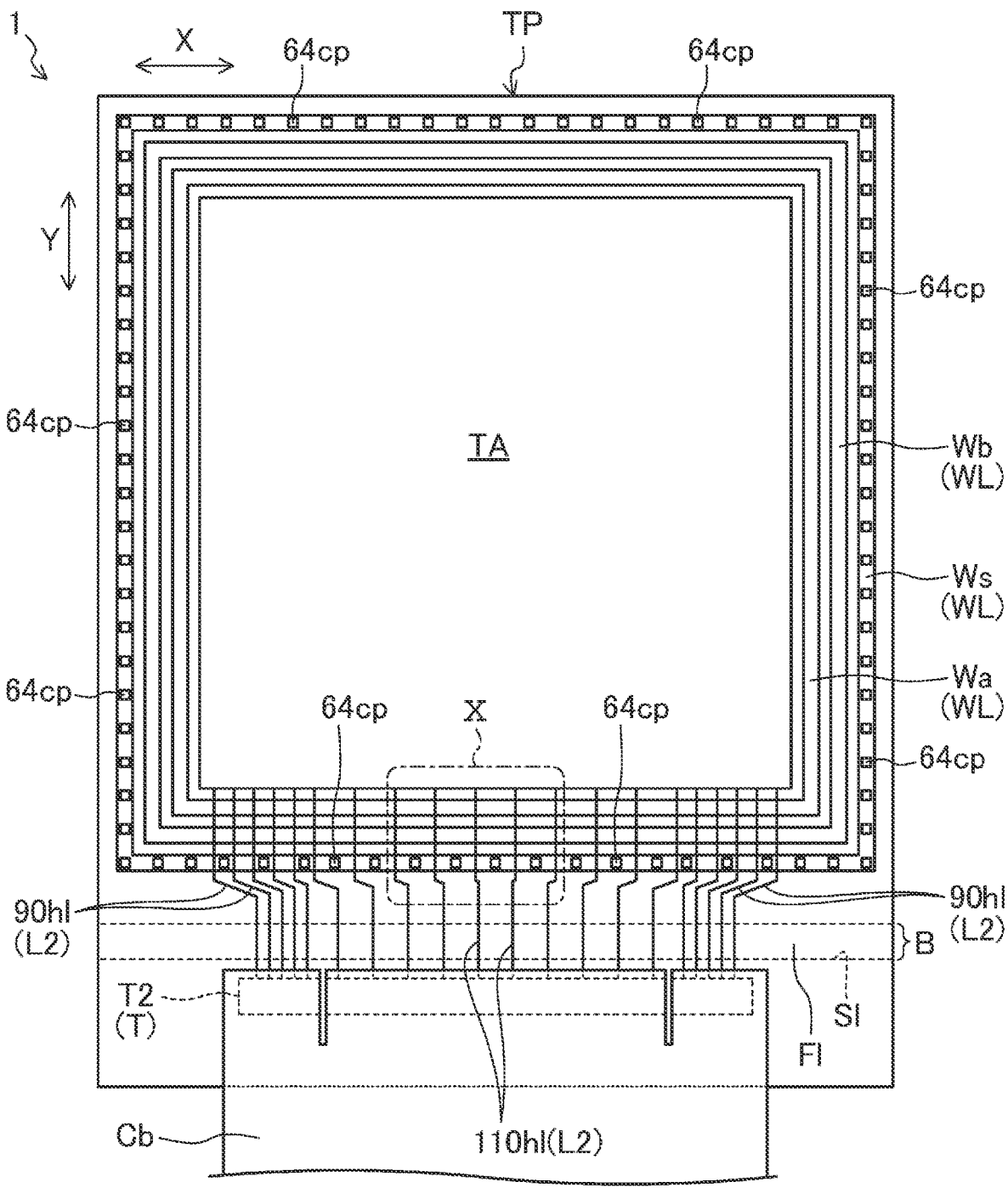
FIG. 9 is a plan view schematically illustrating an example of a main feature of the organic EL display device according to the first embodiment.
Figure 10:
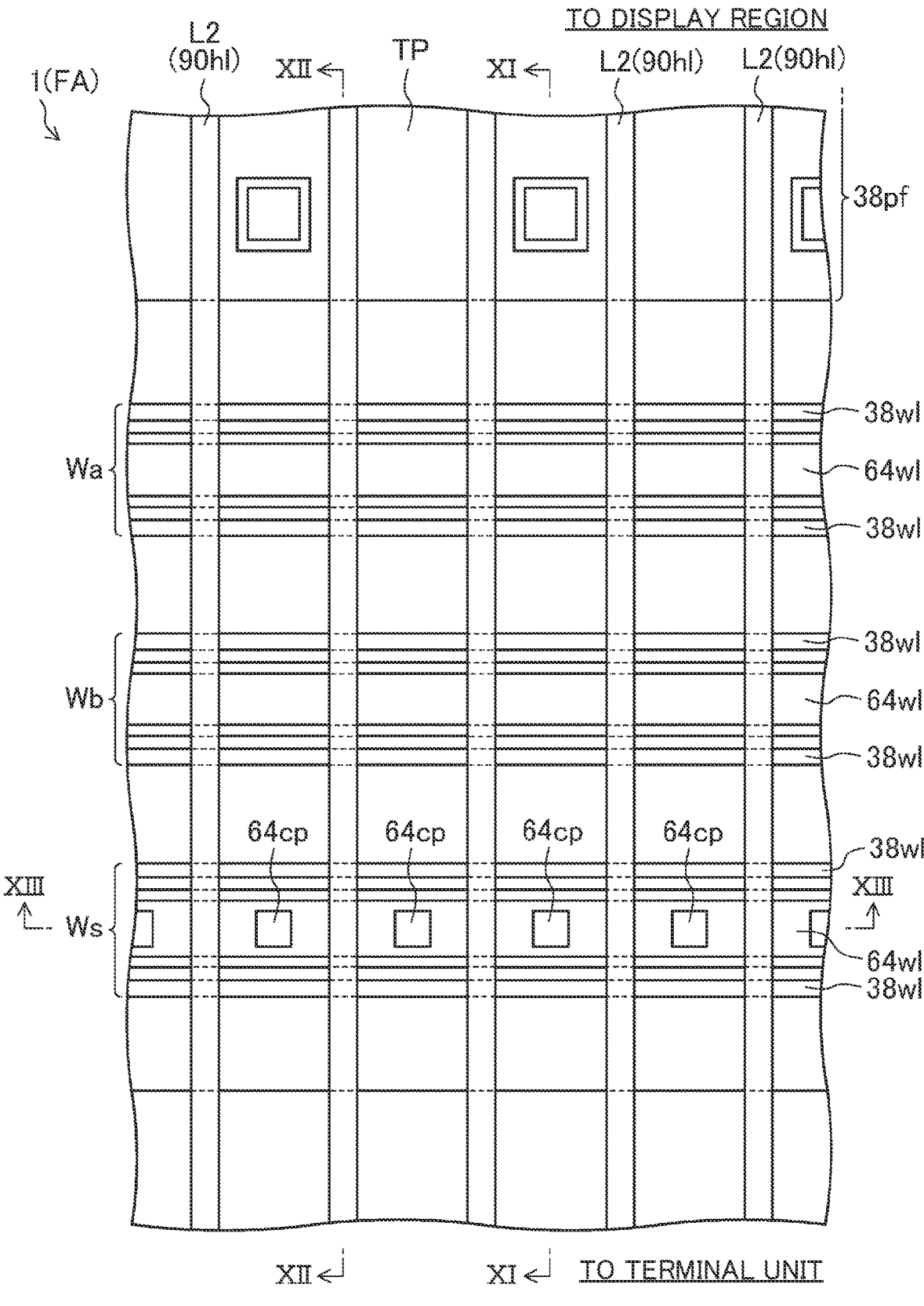
FIG. 10 is an enlarged plan view illustrating an example of a portion surrounded by X in FIG. 9.

As illustrated in FIGS. 9 and 10, the spacer wall Ws has an upper portion provided with a plurality of the protruding portions 64*cp*. Each of the protruding portions 64*cp* is a spot-like protrusion protruding in a height direction of the spacer wall Ws, and is included in the second wall layer 64*wl*. The plurality of protruding portions 64*cp* are formed for an entire perimeter of the spacer wall Ws at intervals along the spacer wall Ws. When an organic resin material forming the organic sealing layer 84 is applied at a step of producing the organic EL display device 1, the spacer wall Ws also functions as a bank for blocking the organic resin material from spreading out of the picture-frame region FA.

Figure 12:
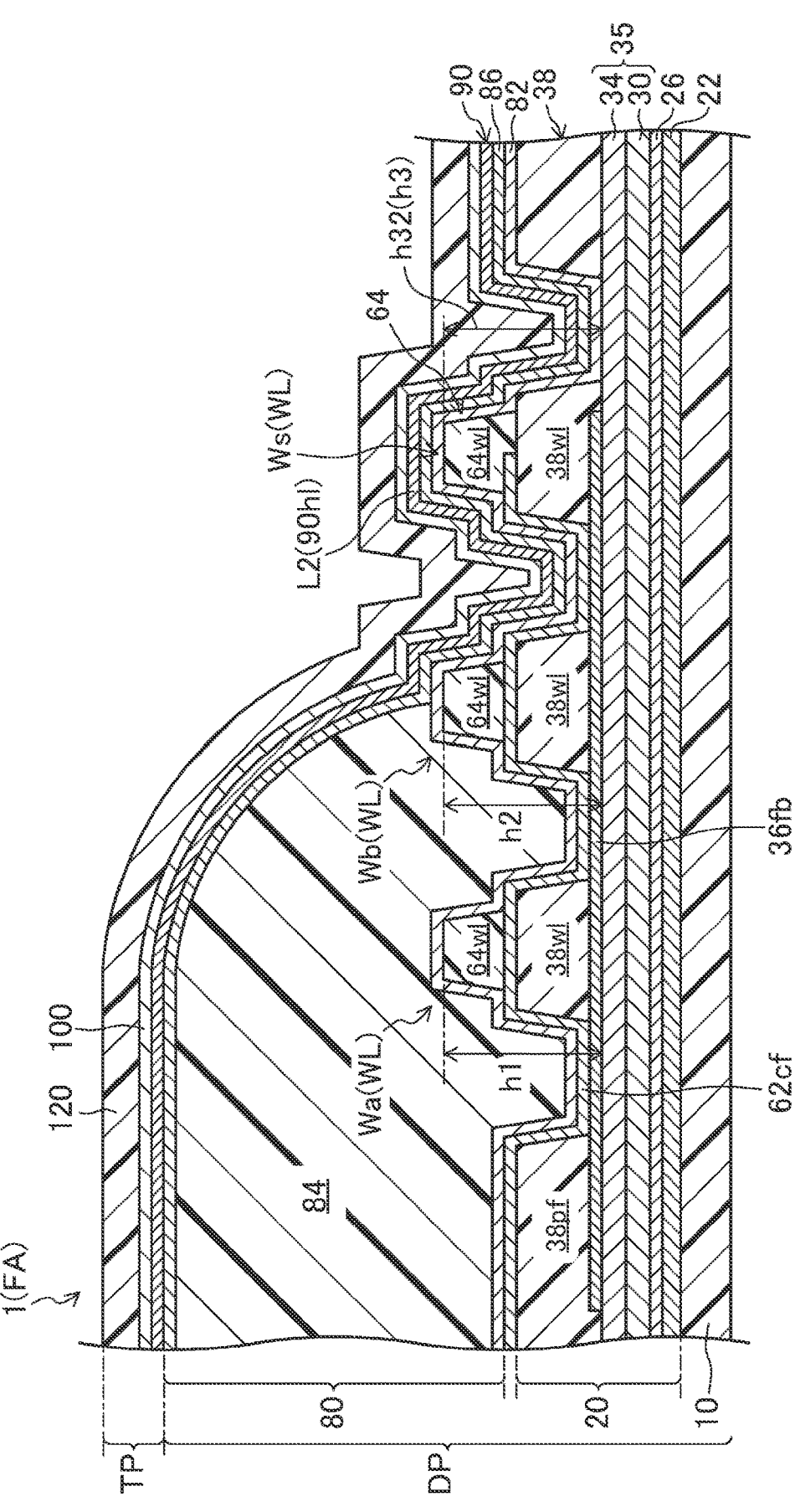
FIG. 12 is a cross-sectional view of the organic EL display device, taken along line XII-XII in FIG. 10.
Figure 13:
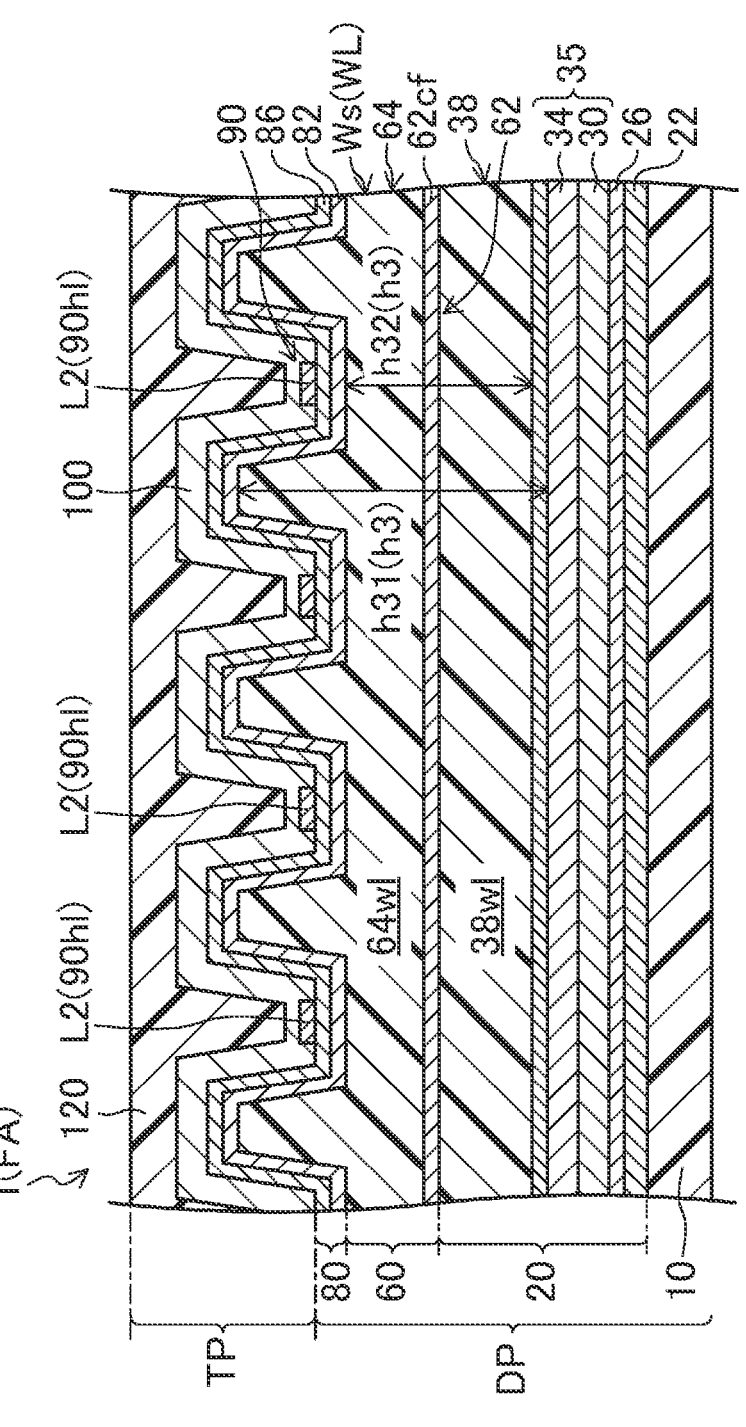
FIG. 13 is a cross-sectional view of the organic EL display device, taken along line XIII-XIII in FIG. 10.

As illustrated in FIGS. 11 and 12, in this example, the height h1 of the first dam wall Wa is equal to the height h2 of the second dam wall Wb. The height h2 of the second dam wall Wb may be greater than the height h1 of the first dam wall Wa. The spacer wall Ws has a portion provided with the protruding portion 64*cp*, and a height h31 of the portion is greater than the height h1 of the first dam wall Wa and the height h2 of the second dam wall Wb. The spacer wall Ws has a portion provided away from the protruding portion 64*cp*, and a height h32 of the portion is equal to the height h1 of the first dam wall Wa and the height h2 of the second dam wall Wb. Compared with a case where there are two dam walls functioning as banks to block an organic resin material forming the organic sealing layer 84, the heights h1, h2, and h3 of the first dam wall Wa, the second dam wall Wb, and the spacer wall Ws do not have to be greater than the two dam walls, At the plurality of the protruding portions 64*cp*, the spacer wall Ws is in contact with the film forming mask MK to be used for forming the organic EL layer 66 and the common electrode 68*ce*. As illustrated in FIGS. 9 to 13, each of the second lead wires L2 extends on the second inorganic sealing layer 86 or the interlayer insulating film 100 to cross a portion, of the spacer wall Ws, away from the protruding portion 64*cp*; specifically, between the adjacent protruding portions 64*cp*. As can be seen, each second lead wire L2 is lead from the display region DA to the second terminal unit T2 through a relatively low portion of the spacer wall Ws. Between the adjacent protruding portions 64*cp*, only one second lead wire L2 may be provided. Alternatively, two or more second lead wires L2 may be provided.

Operation of Organic EL Display Device

In each subpixel Sp of the organic EL display device 1, first, a corresponding emission control wire 28*el* is selected and deactivated, and the organic EL element 70 is in a non-light-emitting state. Then, when a gate wire 28*gl* corresponding to the organic EL element 70 in the non-light-emitting state is selected, and the gate wire 28*gl* is activated, a gate signal is input through the gate wire 28*gl* to the first TFT 50A. Then, the first TFT 50A turns ON.

When the first TFT 50A turns ON, a predetermined voltage, which corresponds to a source signal to be transmitted through a source wire 36*sl*, is applied to the second TFT 50B and written into the capacitor 55. Then, when the emission control wire 28*el* is not selected, and thus is deactivated, an emission signal is input to the third TFT 50C through the emission control wire 28*el*, and the third TFT 50C turns ON.

When the third TFT 50C turns ON, a current corresponding to a gate voltage of the second TFT 50B is supplied from a power source wire Pl to the organic EL element 70. Thus, each organic EL layer 66 (the light-emitting layer 66*le*) emits light, and an image is displayed. Note that, even if the first TFT 50A turns OFF, the gate voltage of the second TFT 9B is held in the capacitor 55. Hence, each subpixel Sp allows the organic EL layer 66 to keep emitting light until a gate signal in a succeeding frame is input.

Method for Producing Organic EL Display Device

In order to produce the organic EL display device 1, first, a surface of a glass substrate is coated with an organic resin material and baked. Thus, the substrate layer 10 is formed. Next, on the substrate layer 10, the TFT layer 20, the light-emitting element layer 60, the sealing film 80, and the touch panel TP are formed in the stated order, using a known technique such as photolithography, vacuum evaporation, or inkjet printing. Then, a laser beam is emitted from toward the glass substrate to a back surface of the substrate layer 10. Thus, the glass substrate is removed from the substrate layer 10.

Subsequently, a back-surface protective film is attached to the back surface of the substrate layer 10. Subsequently, a surface protective film is attached to the surface of the substrate to which the touch panel TP is provided. Next, the wiring board Cb is connected to each of the first terminal unit T1 and the second terminal unit T2 of the substrate. Hence, together with the wiring board Cb, the display control circuit and the touch detecting circuit are mounted. As described above, the organic EL display device 1 is successfully produced.

At a step of forming the TFT layer 20, in forming the first resin layer 38, the substrate, on which the third conductive layer 36 is formed, is coated with a photosensitive resin by a known technique such as, for example, spin coating. Next, the coating film formed of the photosensitive resin material is prebaked, exposed to light, developed, and postbaked. Then, the coating film is patterned to form the first planarization film 38*pf* and the first wall layer 38*wl*.

After that, at a step of forming the light-emitting element layer 60, in forming the second resin layer 64, the substrate, on which the fourth conductive layer 62 is formed, is coated with a photosensitive resin by a known technique such as, for example, spin coating. Then, the coating film formed of the photosensitive resin material is prebaked, exposed to light, developed, and postbaked. Then, the coating film is patterned to form the edge cover 64*ec* and the second wall layer 64*wl*.

Here, when the coating films formed of the photosensitive resin materials are exposed to light, either a grayscale mask or a halftone mask is used. Thus, a difference in height may be given to a surface height of the second wall layer 64*wl* included in the spacer wall Ws, and the protruding portion 64*cp* may be formed in the second wall layer 64*wl*. Simultaneously, a difference in height may be given to a surface height of the edge cover 64ec, and the photo spacer 64ps may be formed on the edge cover 64ec. Thus, the spacer wall Ws is formed together with the first dam wall Wa and the second dam wall Wb, At a step of forming the TFT layer 20, in forming a functional layer (any of the hole injection layer 66hi, the hole transport layer 66ht, the light-emitting layer 66le, the electron transport layer 66et, and the electron injection layer 66ei) included in the organic EL layer 66 and the common electrode 68ce, vacuum evaporation is used. The vacuum evaporation involves sublimating or evaporating a film forming material with a heat of an evaporation source, and depositing a thin film on the substrate. In the vacuum evaporation, a film forming mask MK called, for example, FMM is used.

Figure 14:
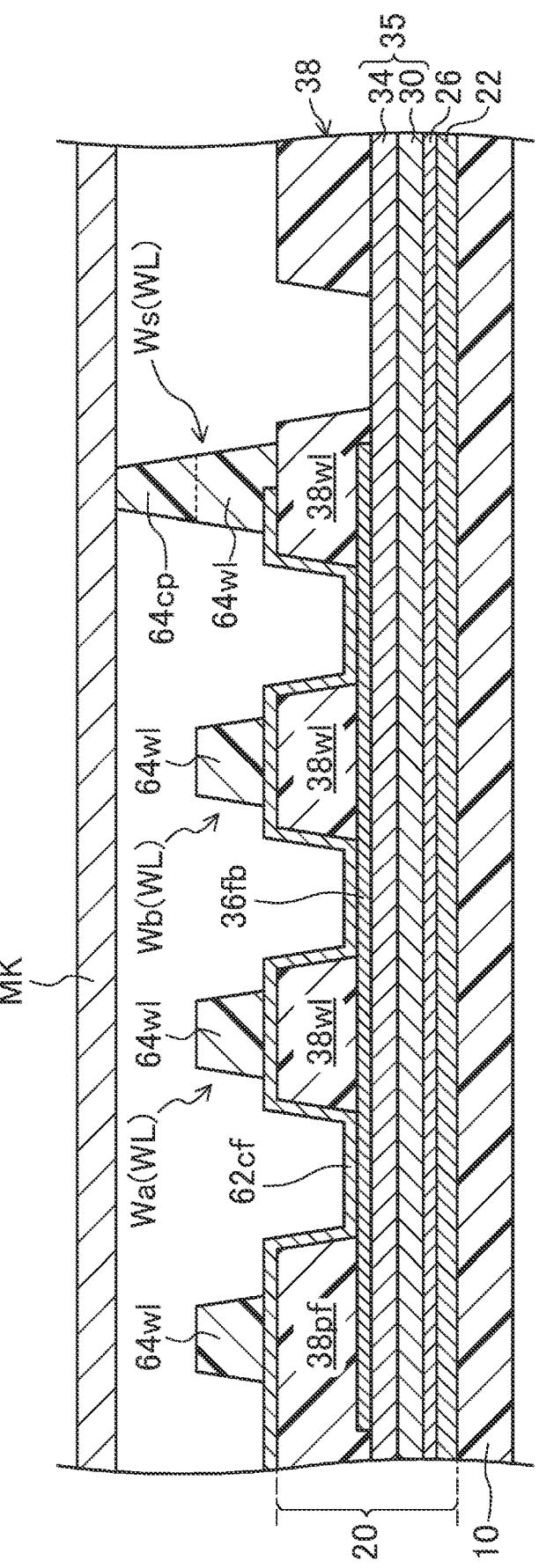
FIG. 14 is a cross-sectional view illustrating an example of a main feature observed when a functional layer and a common electrode of the organic EL layer are formed by evaporation in producing the organic EL display device according to the first embodiment.

The film forming mask MK is disposed inside an evaporation apparatus that deposits a film by vacuum evaporation. When used, the film forming mask MK is attracted by magnetic force toward the substrate on which a film is to be deposited. Hence, as illustrated in FIG. 14, in forming a functional layer included in the organic EL layer 66 and the common electrode 68ce, the film forming mask MK comes into relatively strong contact with the protruding portion 64cp of the spacer wall Ws. Here, top portions of the first dam wall Wa and the second dam wall Wb do not come into contact with the film forming mask MK. When the film forming mask MK is set in the described manner, a film is deposited by vacuum evaporation on the target substrate.

Depending on how the film forming mask MK is in contact with the substrate, the top portion of the protruding portion 64cp wears off. As a result, the top portion might have irregularities, and a foreign substance might be formed on the spacer wall Ws and the surroundings of the spacer wall Ws. However, problems can be averted of the irregularities on the top portions of the first dam wall Wa and the second dam wall Wb and of the foreign substance on the walls Wa and Wb and the surroundings of the walls Wa and Wb. Hence, even if the irregularities are formed on the protruding portion 64cp and the foreign substance is formed on the spacer wall Ws and the surroundings of the spacer wall Ws, the spacer wall Ws and the surroundings of the spacer wall Ws are distant away from a region coated with the organic resin material forming the organic sealing layer 84. Such a feature can reduce the risk of water entering the display region DA even if the sealing film 80 fails to cover the irregularities and the foreign substance, and the resulting coverage failure occurs.

Furthermore, in forming the sixth conductive layer 90 and the seventh conductive layer 110 at a step of forming the touch panel TP, the spacer wall Ws reduces the risk of the second lead wires L2 (the upper lead wires 90hl and the lower lead wires 110hl) to be broken on the wall body WL. Such features will be described below, citing, as an example, a step of forming the sixth conductive layer 90.

Figure 15:
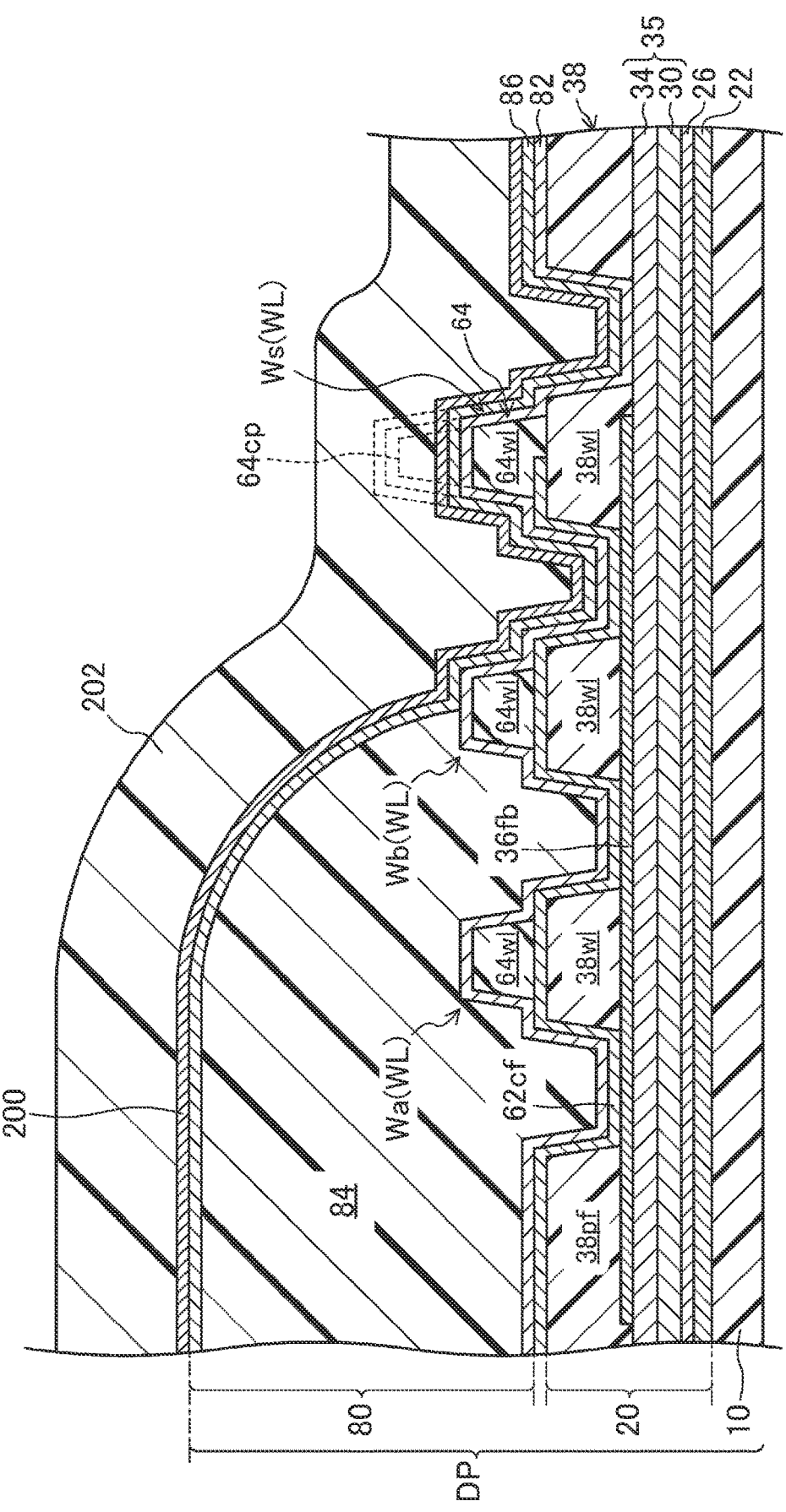
FIG. 15 is a cross-sectional view illustrating an example of how a resist is applied when a wire of the touch panel is patterned in producing the organic EL display device according to the first embodiment.
Figure 16:
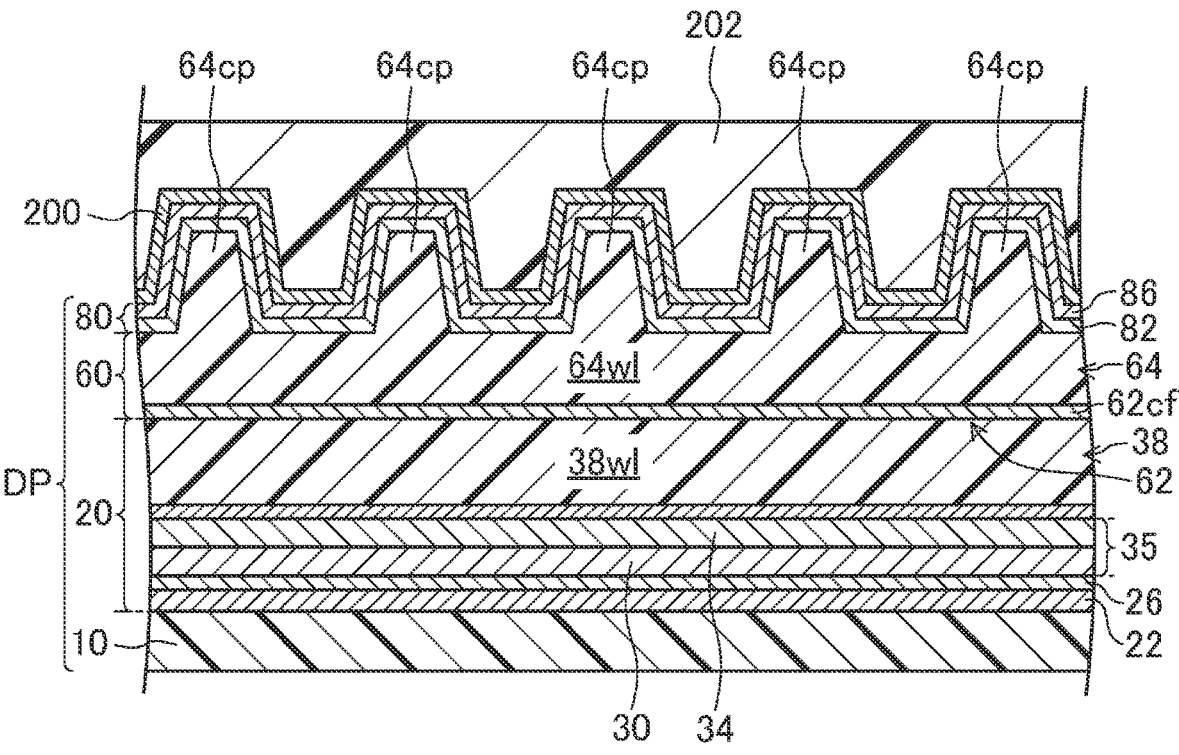
FIG. 16 is a cross-sectional view illustrating an example of how the resist is applied when the wire of the touch panel is patterned in producing the organic EL display device according to the first embodiment.
Figure 17:
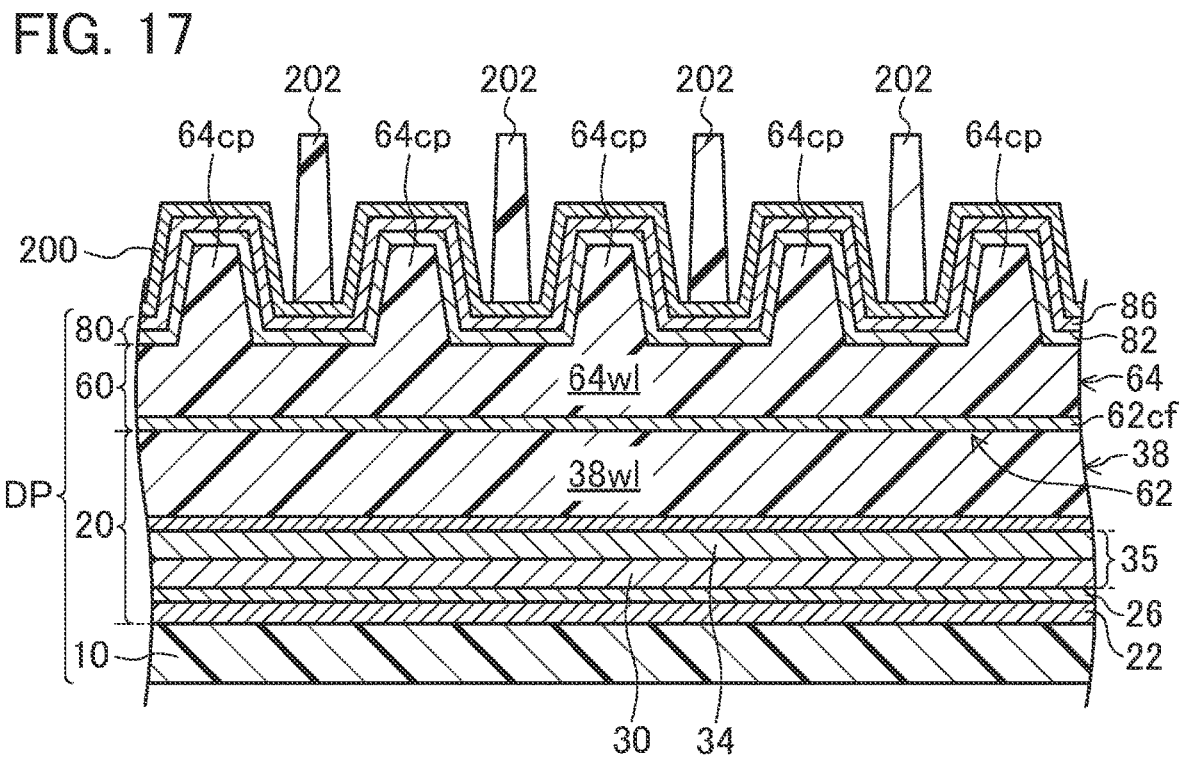
FIG. 17 is a cross-sectional view illustrating an example of how the resist is developed when the wire of the touch panel is patterned in producing the organic EL display device according to the first embodiment.
Figure 18:
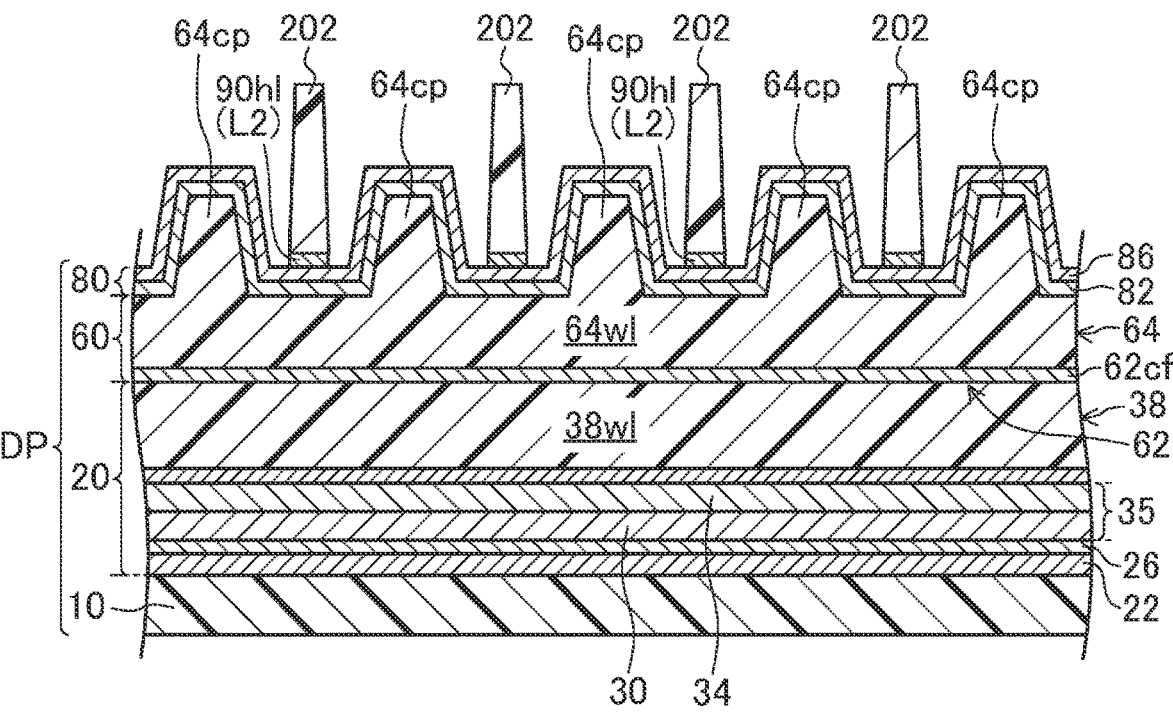
FIG. 18 is a cross-sectional view illustrating an example of how the wire of the touch panel is patterned in producing the organic EL display device according to the first embodiment.

At the step of forming the sixth conductive layer 90, first, on the substrate on which the sealing film 80 is formed, a transparent conductive film 200 is deposited by, for example, sputtering. The transparent conductive film 200 is formed of such a material as indium tin oxide (ITO). Next, as illustrated in FIGS. 15 and 16, the substrate on which the transparent conductive film 200 is deposited is coated with a resist 202 by a known technique as spin coating or slit coating. Subsequently, the coating film of the resist 202 is prebaked, exposed to light, developed, and postbaked. Then, the resist 202 is patterned as illustrated in FIG. 17. After that, as illustrated in FIG. 18, using the resist 202 as a mask, the transparent conductive film 200 is etched and patterned to form the lower led wires 90hl (the second lead wires L2) together with the first detecting electrodes 90de and the first connecting wires 90cl.

Figure 28:
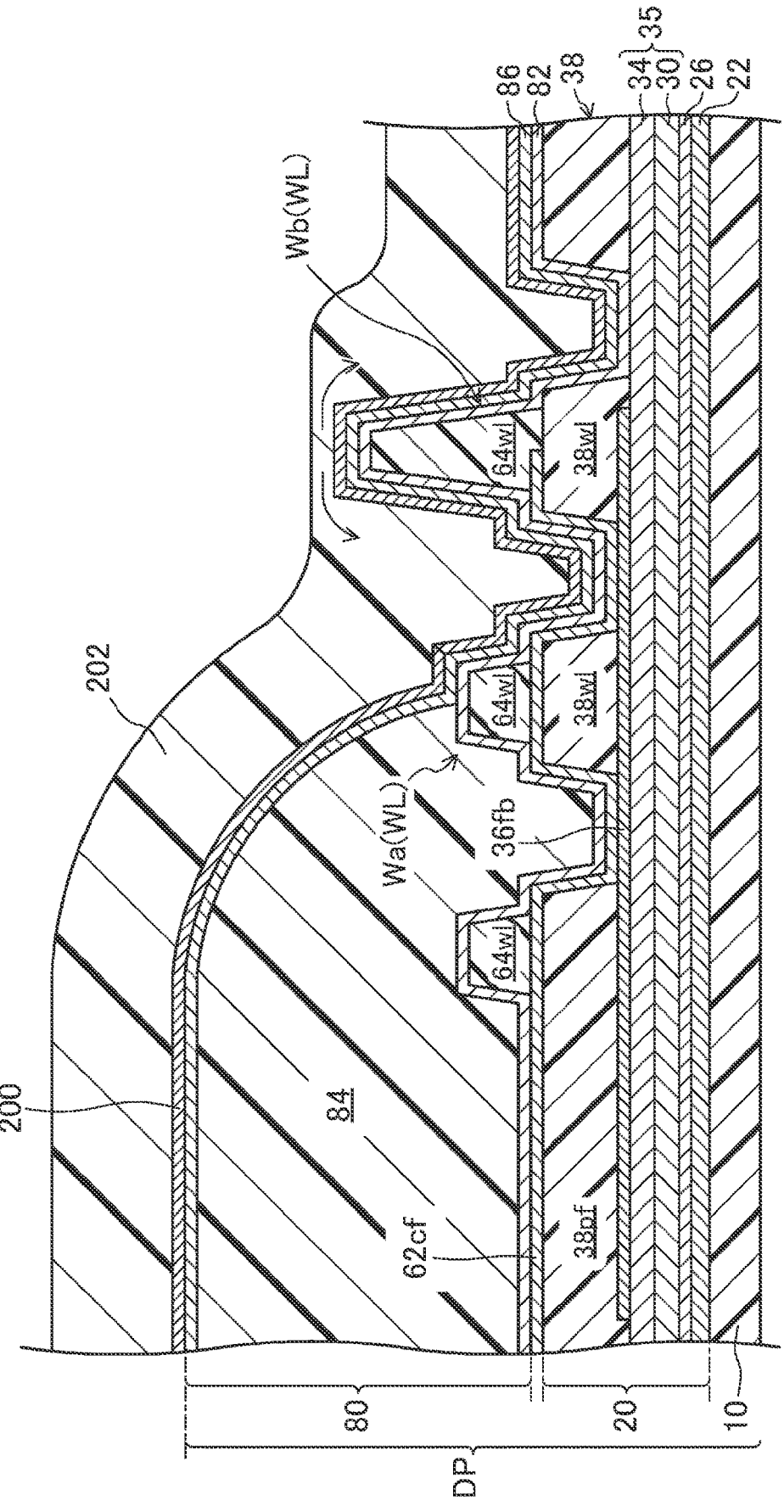
FIG. 28 is a cross-sectional view illustrating how a resist is applied when a wire of a touch panel is patterned in a production process of an organic EL display device according to a comparative example.
Figure 29:
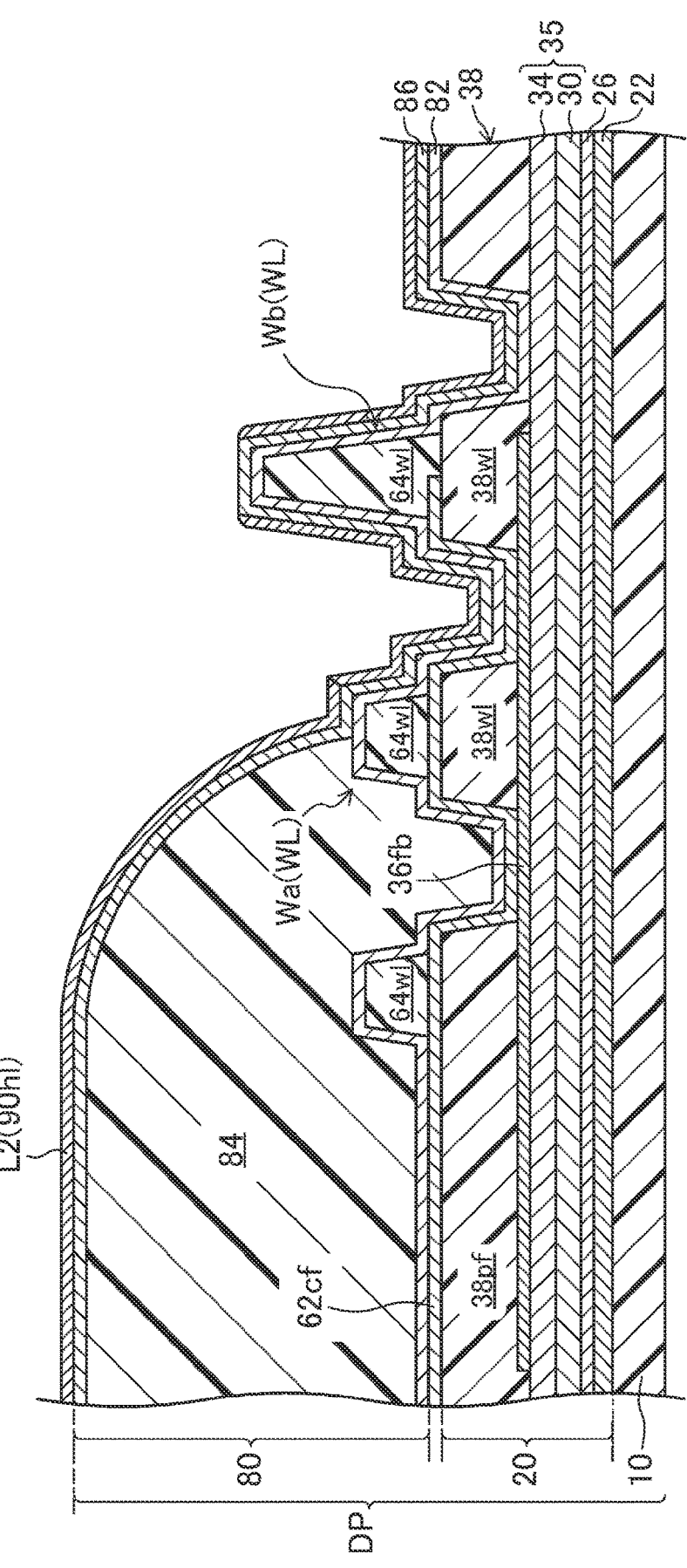
FIG. 29 is a cross-sectional view illustrating how the wire of the touch panel is patterned in the production process of the organic EL display device according to the comparative example.

Here, as illustrated in FIG. 28, if the spacer wall Ws is not provided, the second dam wall Wb has to be formed relatively tall, in order to keep the organic resin material forming the organic sealing layer 84 from spreading out of the picture-frame region FA. The taller the second dam wall Wb is, the more likely the resist 202 flows from the top portion of the second dam wall Wb to both sides, and the less likely the resist 202 ideally covers the top portion of the second dam wall Wb. In this case, in patterning a second lead wire L2, a portion of the transparent conductive film 200 forming the second lead wire L2 on the second dam wall Wb is also inevitably etched. As a result, as illustrated in FIG. 29, the second lead wire L2 is damaged and broken.

In contrast, in the organic EL display device 1 of this example, the spacer wall Ws is provided in addition to the first dam Wa and the second dam wall Wb. Hence, more wall bodies WL are provided to block the organic resin material forming the organic sealing layer 84 from spreading out of the picture-frame region FA. Thanks to such features, the first dam wall Wa and the second dam wall Wb are designed to block most of the organic resin material forming the organic sealing layer 84, thereby successfully reducing a height of a portion, of the spacer wall Ws, with no protruding portion 64cp provided.

Furthermore, in the organic EL display device 1 of this example, the second lead wire L2 is formed to cross a relatively low portion, of the spacer wall Ws, with no protruding portion 64cp provided. Such a feature can reduce the risk of flowing the resist 202 toward both sides from the top portion, of the spacer wall Ws, on which the resist 202 is used for forming the second lead wire L2. Thus, even on a portion, of the spacer wall Ws, on which the second lead wire L2 is formed, the resist 202 is provided to ideally cover the spacer wall Ws, thereby successfully reducing the risk of etching the transparent conductive film 200. As a result, the risk is successfully reduced of the second lead wire to be broken on the spacer wall Ws.

First Modification of First Embodiment

Figure 19:
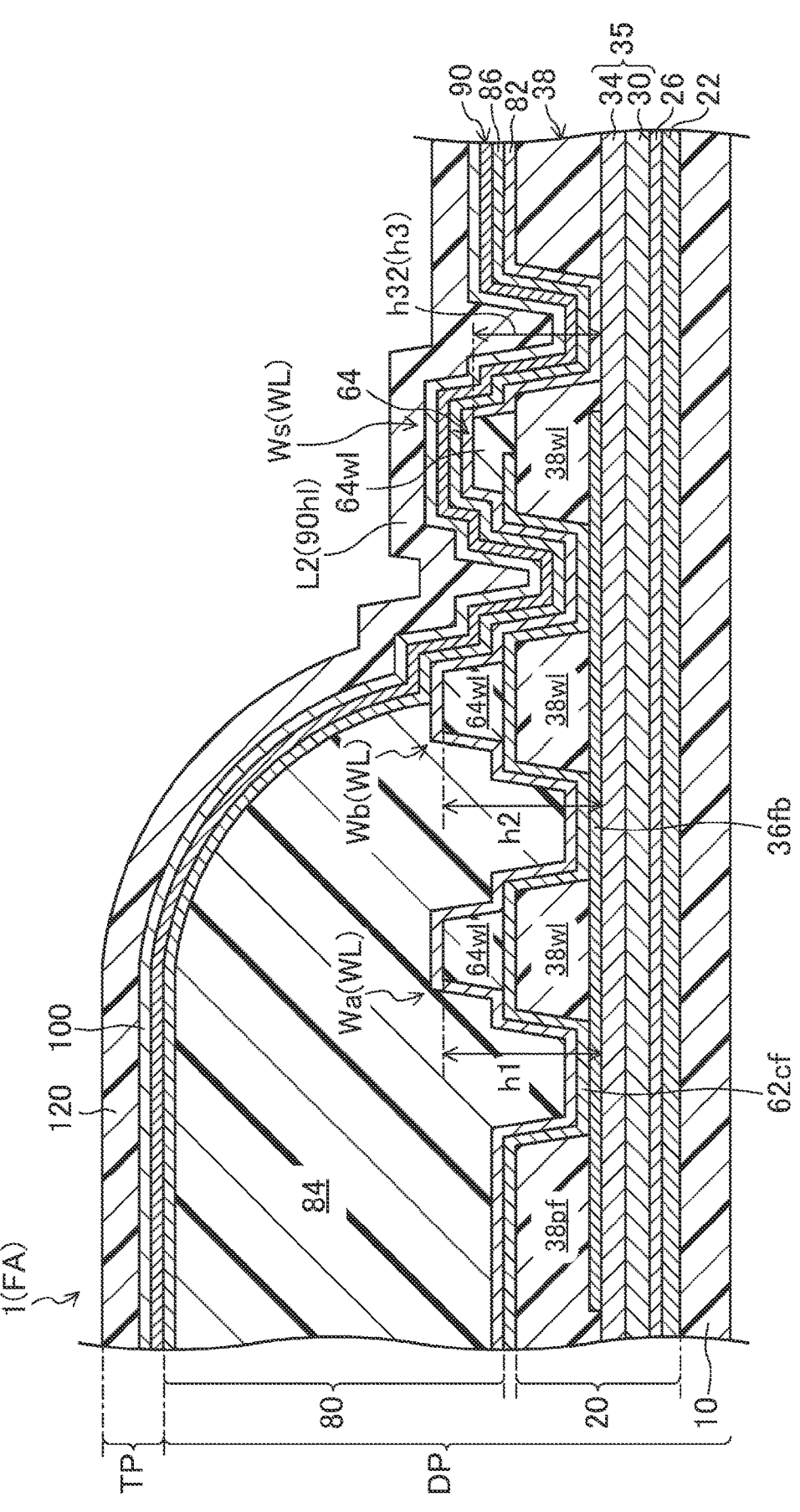
FIG. 19 is a plan view schematically illustrating an example of a main feature of the organic EL display device in a first modification according to the first embodiment.

As illustrated in FIG. 19, the spacer wall Ws has a portion away from the protruding portion 64cp, and the height h32 of the portion from a surface of the interlayer insulating film 35 may be smaller than the height h2 of the second dam wall Wb from the surface of the interlayer insulating film 35. In the first modification, a thickness of the first wall layer 38wl included in the spacer wall Ws is equal to a thickness of the first wall layer 38wl included in the second dam wall Wb. Furthermore, the second wall layer 64wl included in the spacer wall Ws has a portion away from the protruding portion 64cp, and a thickness of the portion is smaller than a thickness of the second wall layer 64wl included in the second dam wall Wb. The former thickness is, for example, 2 µm or less.

A relationship of height between the second dam wall Wb and the portion of the spacer wall Ws away from the protruding portion 64cp may be adjusted with the thickness of the first wall layer 38wl. For example, the second wall layer 64wl included in the spacer wall Ws has a portion away from the protruding portion 64cp, and the thickness of the portion may be equal to the thickness of the second wall layer 64wl included in the second dam wall Wb. Furthermore, the first wall layer 38wl included in the spacer wall Ws has a portion at least away from the protruding portion 64*cp*, and the thickness of the portion may be smaller than the thickness of the first wall layer 38*wl* included in the second dam wall Wb.

The organic EL display device 1 of the first modification can reduce the risks of: water entering the display region DA because of the irregularities formed on the protruding portion 64*cp* and of a foreign substance formed on the spacer wall Ws and the surroundings of the spacer wall Ws; and the second lead wire L2 to be broken on the spacer wall Ws.

Second Modification of First Embodiment

Figure 20:
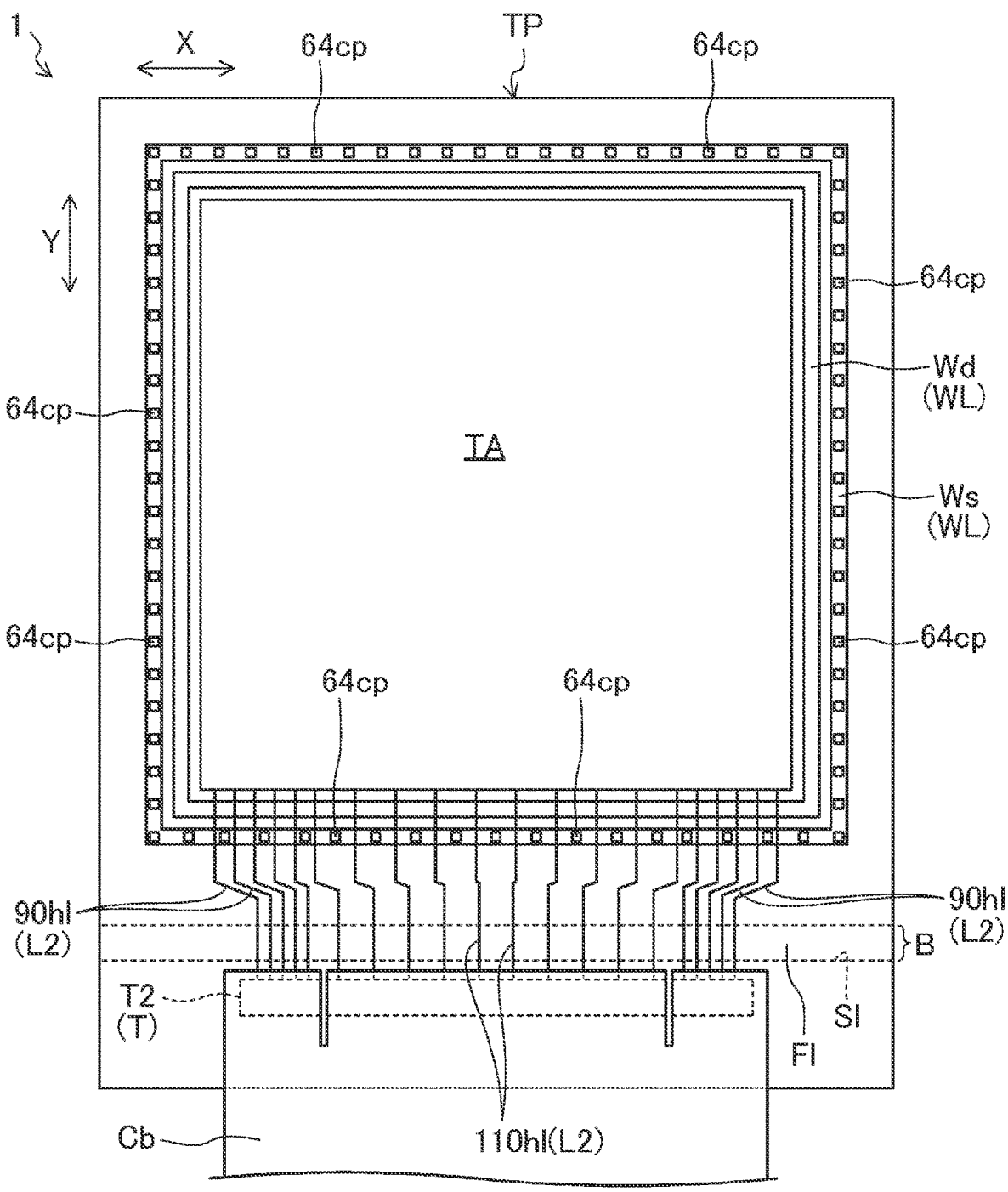
FIG. 20 is a plan view schematically illustrating an example of a main feature of the organic EL display device in a second modification according to the first embodiment.
Figure 21:
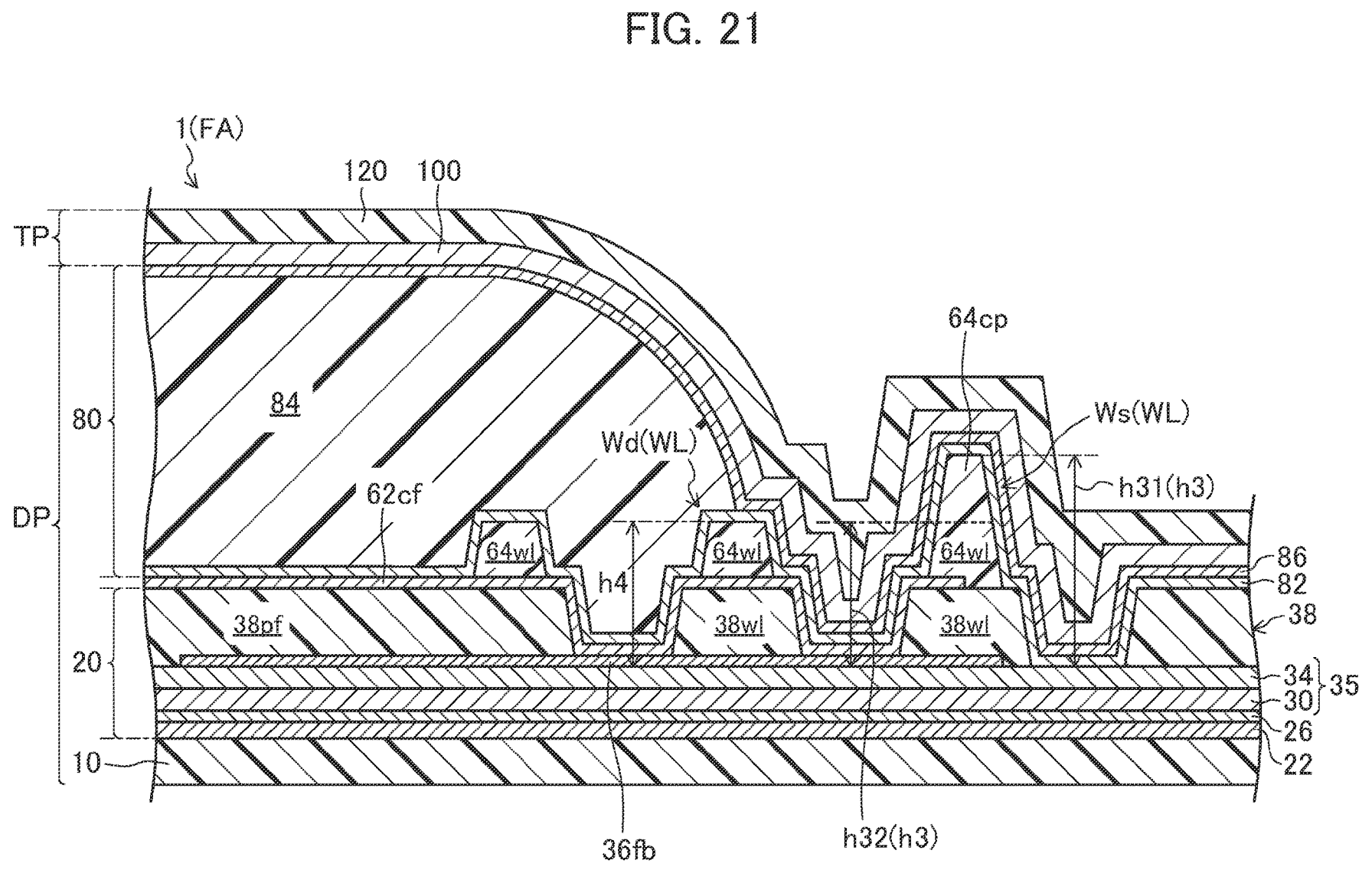

As illustrated in FIGS. 20 and 21, the organic EL display device 1 includes, as the wall bodies WL, a dam wall Wd and the spacer wall Ws alone. That is, the organic EL display device 1 of the second modification corresponds to the organic EL display device 1 of the first embodiment provided with neither the first dam wall Wa nor the second dam wall Wb. A height h4 of the dam wall Wd is designed so that most of an organic resin material forming the organic sealing layer 84 is blocked up to the dam wall Wd.

The spacer wall Ws has a portion provided with the protruding portion 64*cp*, and the height h31 of the portion is greater than the height h4 of the dam wall Wd. The spacer wall Ws has a portion away from the protruding portion 64*cp*, and the height h32 of the portion is equal to the height h4 of the dam wall Wd. Similar to the first modification of the first embodiment, the height h32 of the portion included in the spacer wall Ws and away from the protruding portion 64*cp* may be smaller than the height h4 of the dam wall Wd from the surface of the interlayer insulating film 35.

Second Embodiment

The organic EL display device 1 of the second embodiment is different from the organic EL display device 1 of the first embodiment as to the configurations of the layers included in the TFT layer 20 and of the first dam wall Wa, the second dam wall Wb, and the spacer wall Ws. In the embodiments below, mainly described will be configurations different from those of the first embodiment. The same configurations throughout the embodiments will not be elaborated upon in detail.

Configuration of Layers of TFT Layer

Figure 22:
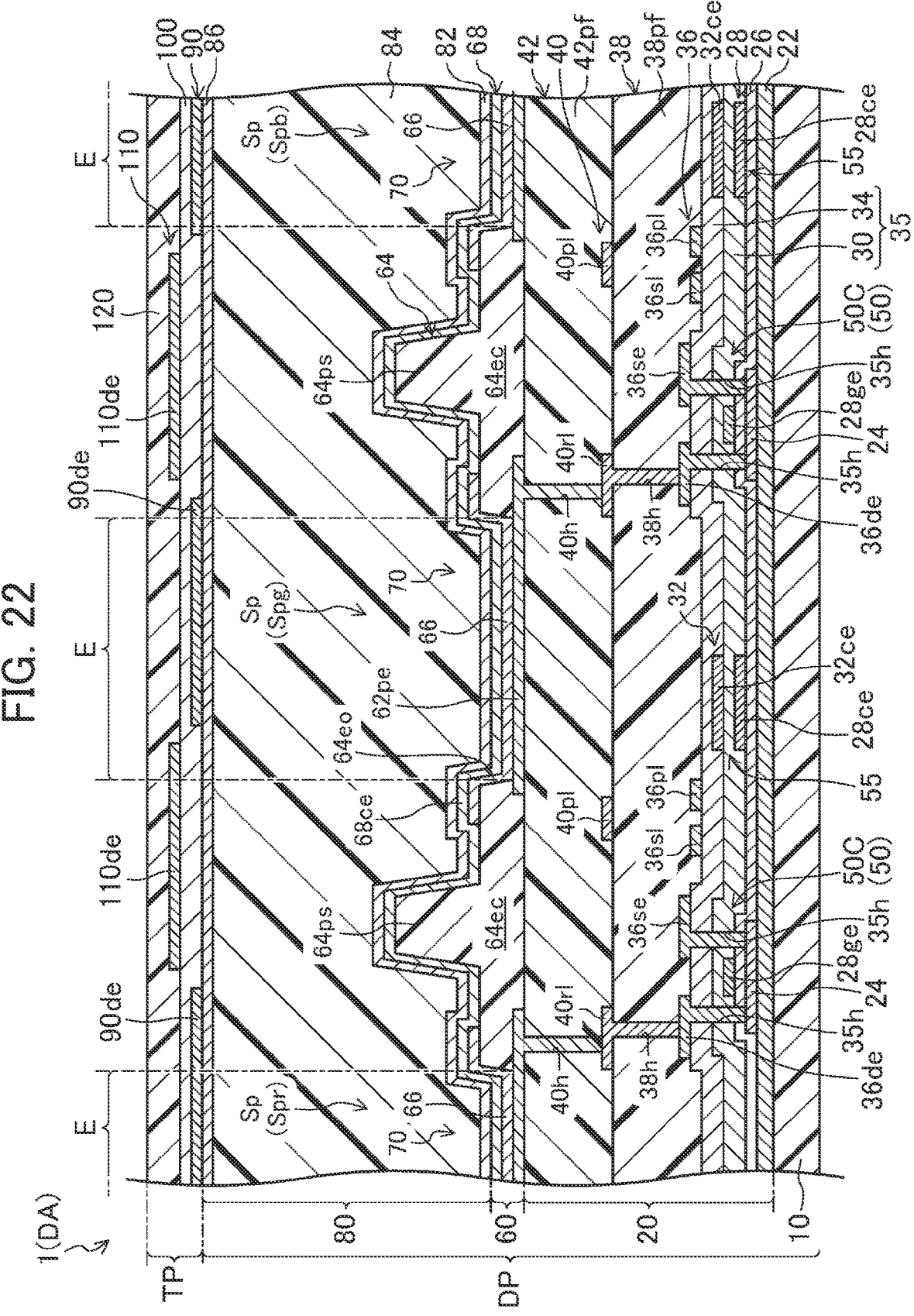
FIG. 22 is a cross-sectional view of an organic EL display device according to a second embodiment.

As to the organic EL display device 1 according to the second embodiment, as illustrated in FIG. 22, the TFT layer 20 includes: the base coat film 22; the semiconductor layer 24; the gate insulating film 26; the first conductive layer 28; the first interlayer insulating film 30; the second conductive layer 32; the second interlayer insulating film 34; the third conductive layer 36; and the first resin layer 38. The TFT layer 20 further includes an eighth conductive layer 40 and a third resin layer 42 both provided between the first resin layer 38 and the light-emitting element layer 60 (the fourth conductive layer 62).

The eighth conductive layer 40 is provided on the first resin layer 38. The eighth conductive layer 40 includes: a third power source wire 40*pl*; and a plurality of relay wires 40*rl*. These third power source wire 40*pl* and relay wires 40*rl* are formed of the same material and in the same layer. The various wires included in the eighth conductive layer 40 are made of the above-described metal materials similar to the metal materials of, for example, the first conductive layer 28, the second conductive layer 32, and the third conductive layer 36. Such various wires are monolayer films or multilayer films made of such metal materials.

Figure 23:
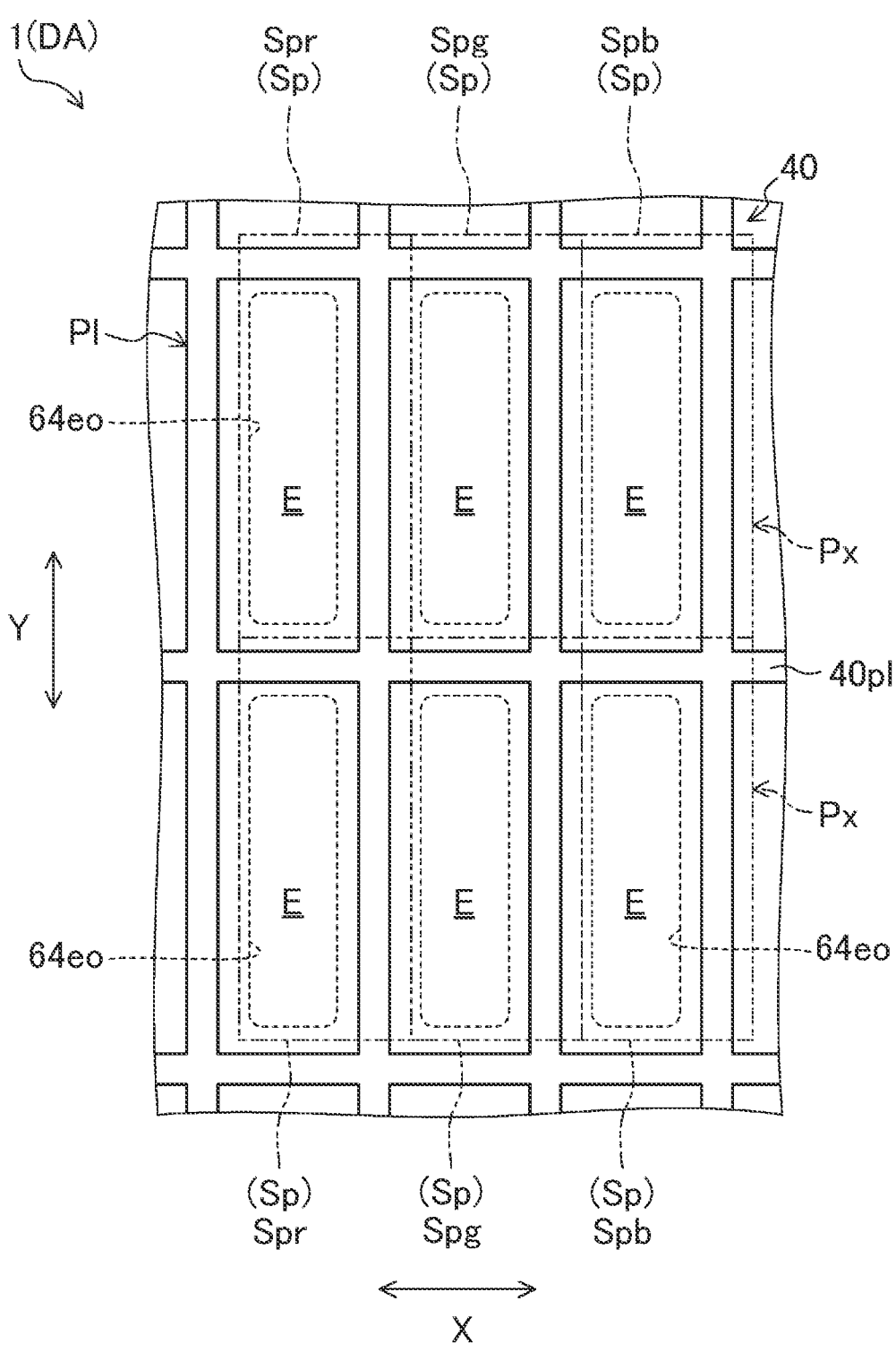
FIG. 23 is a plan view illustrating an example of pixels included in a display region, and display wires included in an eighth conductive layer, of the organic EL display device according to the second embodiment.

As illustrated in FIG. 23, the third power source wire 40*pl* is formed in a grid pattern, and extends in the first direction X and the second direction Y. The third power source wire 40*pl* is connected either to the second power source wire 36*pl* through a contact hole (not shown) formed in the first planarization film 38*pf*, or to the first picture-frame wire 36*fa* outside the first planarization film 38*pf*. The third power source wire 40*pl* constitutes the power source wire PI, together with the first power source wire 32*pl* and the second power source wire 36*pl*.

The plurality of relay wires 40*rl* are provided on the first planarization film 38*pf* in the display region DA. Each of the relay wires 40*rl* is shaped into an island and formed for a corresponding one of the subpixels Sp. Each relay wire 40*rl* relays connection between the drain electrode 36*de* of a predetermined TFT50 and an electrode of the organic EL element 70. Specifically, each relay wire 40*rl* is connected to the drain electrode 36*de* of a third TFT 50C, through a contact hole 38*h* formed in the first planarization film 38*pf*. Then, each relay wire 40*rl* is connected to a pixel electrode 62*pe* through a contact hole 40*h* formed in the second planarization film 42*pf*.

Figure 24:
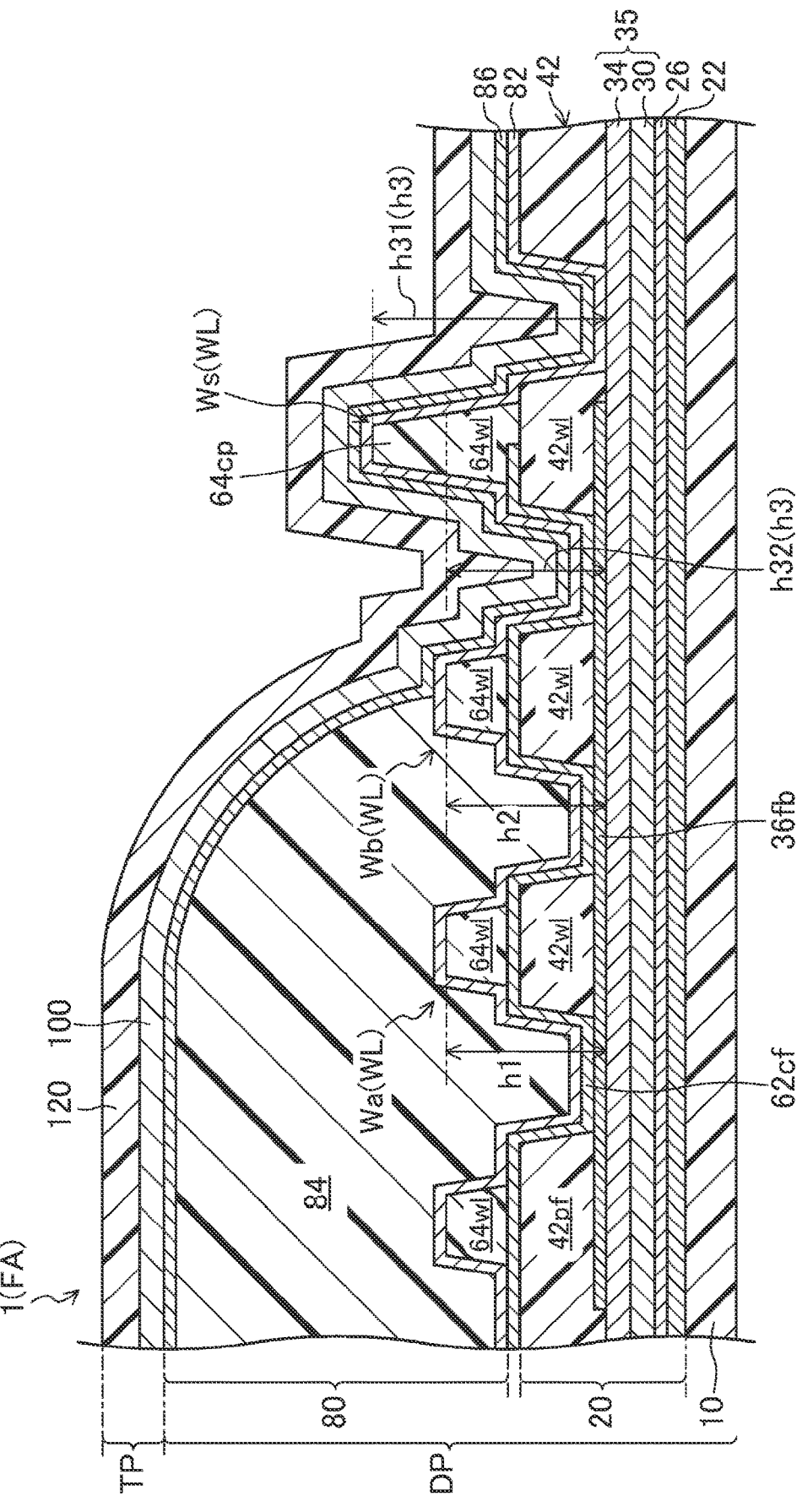
FIG. 24 is a cross-sectional view of the organic EL display device according to the second embodiment.

The third resin layer 42 is provided on the eighth conductive layer 40. As illustrated in FIGS. 23 and 24, the third resin layer 42 includes: the second planarization film 42*pf*; and a third wall layer 42*wl*. These second planarization film 42*pf* and third wall layer 42*wl* are formed of the same material and in the same layer. The second planarization film 42*pf* covers, in the display region DA, various kinds of wires included in the eighth conductive layer 40. The second planarization film 42*pf* planarizes the surface of the TFT layer 20, together with the first planarization film 38*pf*. The third wall layer 42*wl* is an example of a lower wall layer.

The third wall layer 42*wl* includes three third wall layers 42*wl* provided instead of the first wall layers 38*wl* of the organic EL display device 1 according to the first embodiment. The third wall layers 42*wl* are provided toward an outer periphery of the second planarization film 42*pf*. That is, the organic EL display device 1 of this example omits the first wall layers 38*wl*. The three third wall layers 42*wl* are formed in the same shape as that of the first wall layers 38*wl* according to the first embodiment. The third wall layers 42*wl* are the same in thickness, and form lower layers of the first dam wall Wa, the second dam wall Wb, and the spacer wall Ws.

First Dam Wall, Second Dam Wall, and Spacer Wall

As illustrated in FIG. 24, each of the first dam wall Wa, the second dam wall Wb, and the spacer wall Ws includes: the third wall layer 42*wl*; and the second wall layer 64*wl*. The three second wall layers 64*wl* are provided on the respective third wall layers 42*wl*, and form upper portions of the first dam wall Wa, the second dam wall Wb, and the spacer wall Ws.

Thus, as can be seen in the first embodiment, the plurality of protruding portions 64*cp* are formed in an upper portion of the second wall layer 64*wl*. Furthermore, each second lead wire L2 is provided away from the protruding portion 64*cp* to cross the spacer wall Ws. Note that each of the first dam wall Wa and the second dam wall Wb may be formed only of either the third wall layer 43*wl* or the second wall layer 64*wl*.

Modification of Second Embodiment

Figure 25:
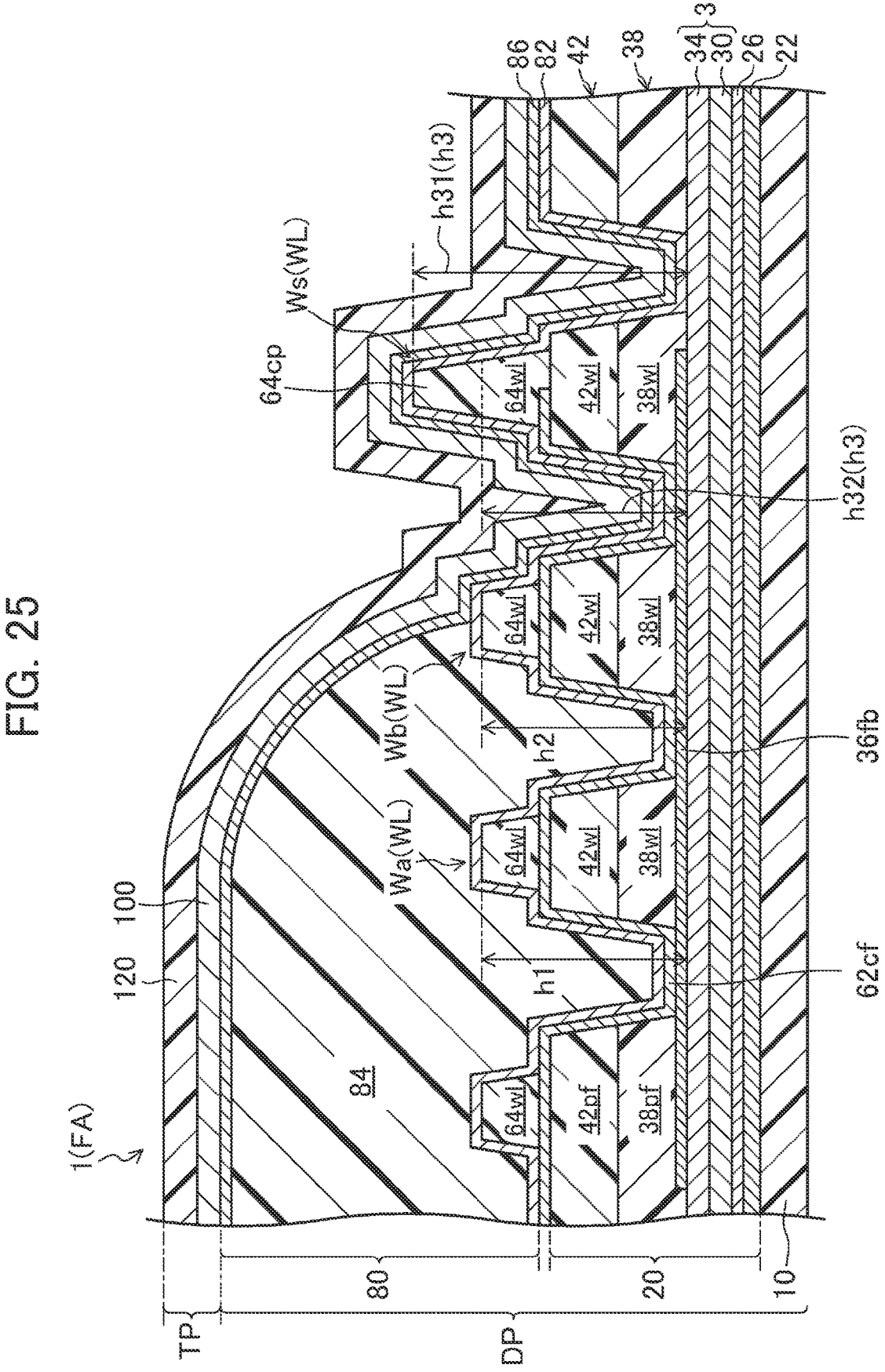
FIG. 25 is a cross-sectional view of the organic EL display device in a modification according to the second embodiment.

As illustrated in FIG. 25, in the organic EL display device 1 of the second embodiment, the third wall layers 42*wl* may be added to the respective lower wall layers 38*wl*. In the organic EL display device 1 of this example, the third wall layers 42*wl* are provided on the respective first wall layers 38*wl*, and disposed between the first wall layers 38*wl* and the second wall layers 64*wl*. In this case, the first wall layers 38*wl* correspond to the lower wall layers, and the second wall layers 64*wl* correspond to the upper wall layers.

Each of the first dam wall Wa, the second dam wall Wb, and the spacer wall Ws includes: the first wall layer 38*wl*; third wall layer 42*wl*; and the second wall layer 64*wl*, all of which are provided in the stated order above the third conductive layer 36. Note that each of the first dam wall Wa and the second dam wall Wb may include either any one of the first wall layer 38*wl*, the third wall layer 42*wl*, and the second wall layer 64*wl*, or a combination of two of the layers.

Furthermore, the spacer wall Ws may include the first wall layer 38*wl* and the third wall layer 42*wl*, and omit the second wall layer 64*wl*. In this case, the first wall layer 38*wl* corresponds to the lower wall layer, and the third wall layer 42*wl* corresponds to the upper wall layer. The protruding portion 64*cp* is formed in an upper portion of the third wall layer 42*wl*.

Third Embodiment

Figure 26:
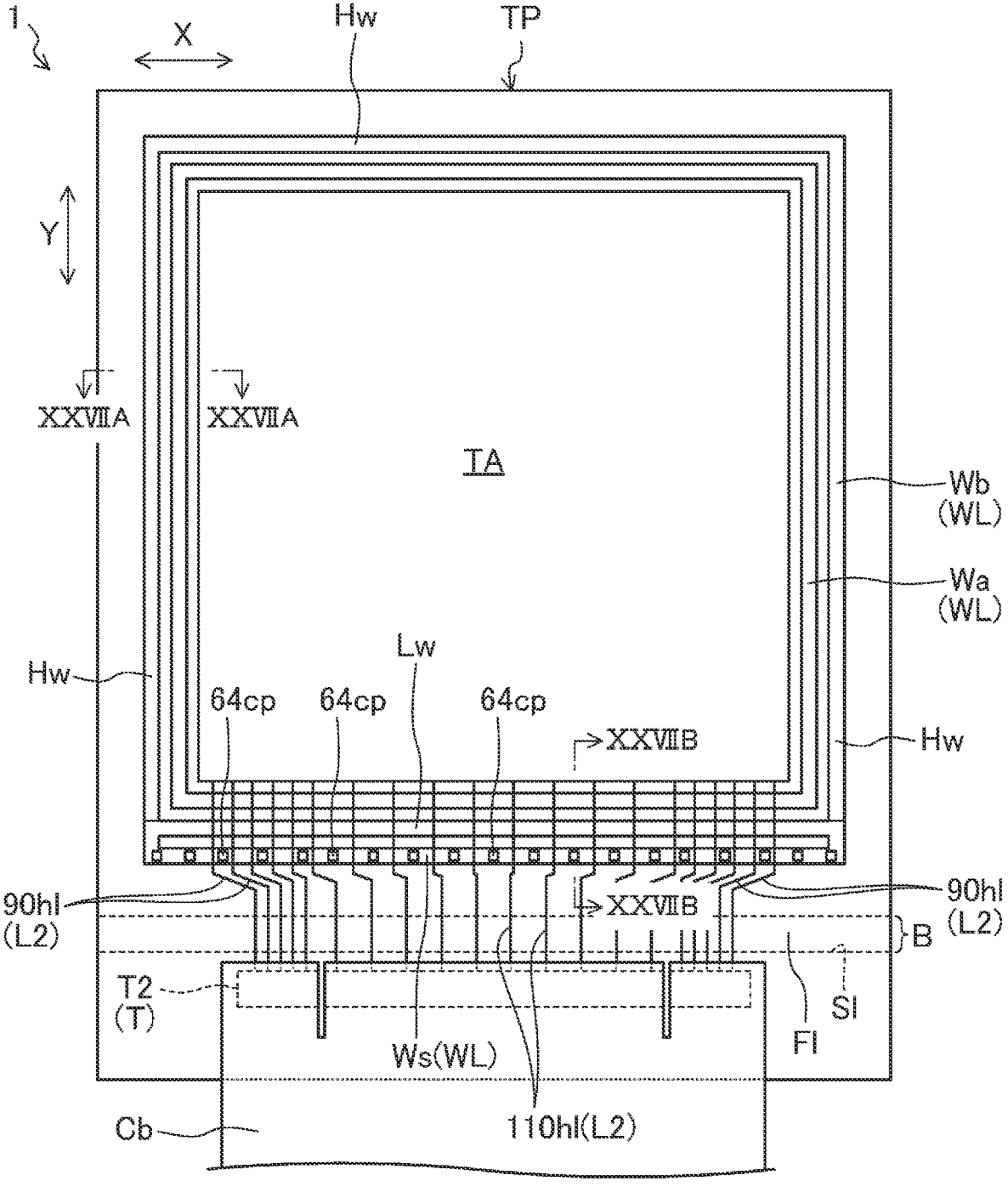
FIG. 26 is a plan view of an organic EL display device according to a third embodiment.
Figure 27:
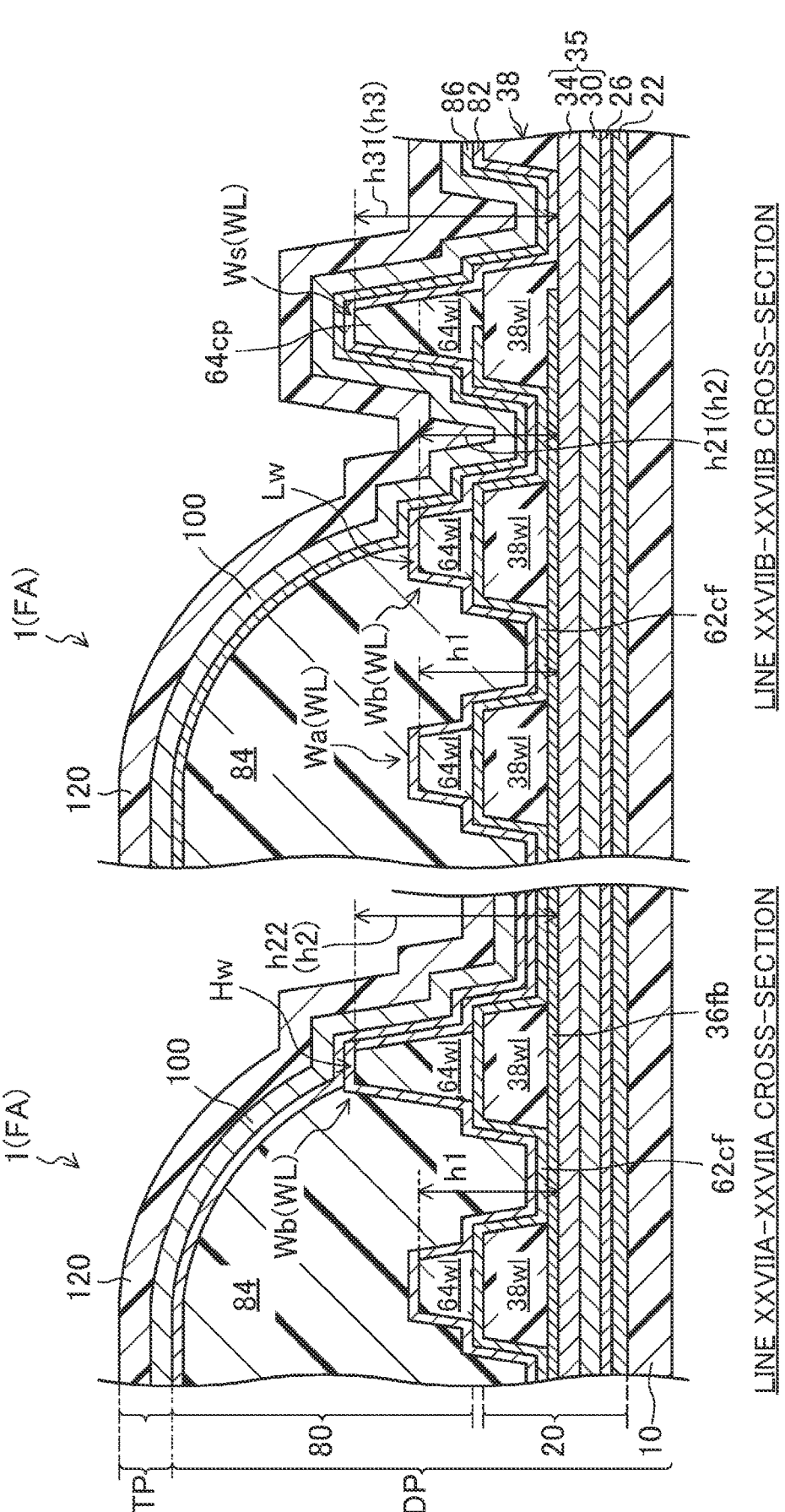
FIG. 27 illustrates: a cross-sectional view (on the left) of the organic EL display device, taken along line XXVIIA- XXVIIA in FIG. 26; and a cross-sectional view (on the right) of the organic EL display device, taken along line XXVIIB-XXVIIB in FIG. 26.

The organic EL display device 1 of this third embodiment is different from the organic EL display device 1 of the first embodiment as to the configuration of the spacer wall Ws. As illustrated in FIG. 26, in the organic EL display device 1 according to the third embodiment, the spacer wall Ws is provided only in a portion forming a side, of the picture-frame region FA, toward the terminal unit T. As illustrated in FIG. 27, the second dam wall Wb includes: a short wall portion Lw that is relatively short; and a tall wall portion Hw that is relatively tall.

The short wall portion Lw is provided to a portion forming a side, of the picture-frame region FA, toward the terminal unit T. The tall wall portion Hw is provided to portions forming three sides other than the side toward the terminal unit T. A height h21 of the short wall portion Lw is equal to the height h1 of the first dam wall Wa. A height h22 of the tall wall portion Hw is equal to a height h3 of the spacer wall Ws (strictly, the height h31 of the protruding portion 64*cp* in the spacer wall Ws). The second dam wall Wb, together with the spacer wall Ws, comes into contact with the film forming mask MK at the tall wall portion Hw. The film forming mask MK is used for forming a functional layer included in organic EL layer 66 and the common electrode 68*ce*.

Other Embodiments

In the first to third embodiments, each protruding portion 64*cp* is, but not limited to, a spot-like protrusion. The protruding portion 64*cp* may be a linear protrusion extending along the spacer wall Ws as long as the second lead wire L2 is provided to cross the spacer wall Ws away from the protruding portion 64*cp*. The spacer wall Ws may extend in the outer peripheries of the first dam wall Wa and the second dam wall Wb or the outer periphery of the dam wall Wd, along a portion, of either the first dam wall Wa and the second dam wall Wb or the dam wall Wd, intersecting at least with the second lead wires L2.

In the first to third embodiments, the organic EL layer 66 is individually provided for, but not limited to, each of the subpixels Sp. The organic EL layer 66 may be provided monolithically in common to a plurality of subpixels Sp. In this case, the organic EL display device 1 may include, for example, a color filter so that each of the subpixels Sp presents a color tone.

In the first to third embodiment, each pixel Px includes the subpixels Spr, Spg, and Spb presenting, but not limited to, three colors. The colors of the subpixels Sp included in each pixel Px are not limited to three colors. The colors may be four or more colors. Furthermore, the subpixels Spr, Spg, and Spb included in each pixel Px and presenting three colors are arranged in, but not limited to, stripes. The plurality of subpixels Sp may be arranged in another manner such as PenTile Matrix.

In the first to third embodiments, all of the first TFT 50A, the second TFT 50B, and the third TFT 50C are, but not limited to, top-gate TFTs. The first TFT 50A, the second TFT 50B, and the third TFT 50C may be bottom-gate TFTs. Moreover, each subpixel Sp may include two TFTs 50, or four or more TFTs 50.

In the first to third embodiments, each pixel electrode 62*pe* and the common electrode 68*ce* are respectively, but not limited to, an anode and a cathode. The pixel electrode 62*pe* may be a cathode, and the common electrode 68*ce* may be an anode. In this case, the organic EL layer 66 has an inverted multilayer structure.

In the first to third embodiments, the organic EL layer 66 have, but not limited to, a five-layer structure including the hole injection layer 66*hi*, the hole transport layer 66*ht*, the light-emitting layer 66*le*, the electron transport layer 66*et*, and the electron injection layer 66*ei*. The organic EL layer 66 may have a three-layer structure including a hole injection and transport layer, the light-emitting layer, and an electron transport and injection layer. The organic EL layer 66 can have any given multilayer structure.

In the first to third embodiments, the example of the display device is, but not limited to, the organic EL display device 1. A technique of the present disclosure is applicable to, for example, a display device including a plurality of light-emitting elements driven by a current. Examples of such a display device include a display device provided with quantum-dot light-emitting diodes (QLEDs); that is, light-emitting elements including layers containing quantum dots.

As can be seen, preferred embodiments have been described as examples of the technique of the present disclosure. However, the technique of the present disclosure shall not be limited to the above examples. The technique is applicable to embodiments with appropriate modifications such as changes, substitutions, additions, and omissions of features. It will be understood by those skilled in the art that various modifications can be made to the above embodiments without departing from the spirit of the present disclosure, and that such modifications fall within the scope of the present disclosure.

The invention claimed is:

1. A display device, comprising: a substrate layer; a light-emitting element layer supported by the substrate layer and including a plurality of light-emitting elements; a sealing film provided above the light-emitting element layer and covering the plurality of light-emitting elements; and a display region configured to display an image using light emitted from the light-emitting elements, and a picture-frame region provided outside the display region, wherein the sealing film includes an organic sealing layer provided to the display region, the picture-frame region includes: a wall body extending along an outer periphery of the display region; and a wire running from the display region, crossing the wall body, and extending out of the picture-frame region, the wall body includes: a dam wall that keeps an organic material, forming the organic sealing layer, from spreading out of the picture-frame region; and a spacer wall extending in an outer periphery of the dam wall along a portion, of the dam wall, intersecting at least with the wire, the spacer wall has an upper portion provided with a plurality of protruding portions extending in a height direction of the spacer wall at intervals along the dam wall, and the wire extends to cross a portion, of the spacer wall, away from the protruding portions.

2. The display device according to claim 1, wherein the spacer wall has the portion away from the protruding portion, and a height of the portion is smaller than a height of the dam wall.

3. The display device according to claim 1- or 2, wherein each of the dam wall and the spacer wall includes: a lower wall layer; and an upper wall layer provided above the lower wall layer, and each of the protruding portions is the upper wall layer of the spacer wall.

4. The display device according to claim 3, further comprising a thin-film transistor layer provided between the substrate layer and the light-emitting element layer, and including a plurality of thin-film transistors, wherein the thin-film transistor layer includes a planarization film provided to cover the plurality of thin-film transistors, the light-emitting element layer includes: a plurality of pixel electrodes; and an edge cover provided to partition the pixel electrodes, the lower wall layer is formed of a same material as, and in a same layer as, the planarization film, and the upper wall layer is formed of a same material as, and in a same layer as, the edge cover.

5. The display device according to claim 3, further comprising a thin-film transistor layer provided between the substrate layer and the light-emitting element layer, and including a plurality of thin-film transistors, wherein the thin-film transistor layer includes: a first planarization film provided to cover the plurality of thin-film transistors; a conductive layer provided on the first planarization film; and a second planarization film provided on the conductive layer, the light-emitting element layer includes: a plurality of pixel electrodes; and an edge cover provided to partition the pixel electrodes, the lower wall layer is formed of a same material as, and in a same layer as, the second planarization film, and the upper wall layer is formed of a same material as, and in a same layer as, the edge cover.

6. The display device according to claim 1, wherein the spacer dam wall extends along an entire outer periphery of the dam wall.

7. The display device according to claim 1, wherein the spacer wall is provided only in a portion forming a side, of the picture-frame region, at which the dam wall and the wire intersect with each other.

8. The display device according to claim 1, further comprising a touch panel provided on the sealing film, wherein the touch panel includes a plurality of detecting electrodes provided in a touch region set to overlap with the display region, and the wire is a lead wire included in the touch panel and led from the detecting electrodes to the picture-frame region.

9. The display device according to claim 1, wherein the light-emitting elements are organic electroluminescence elements.

* * * * *